(12) United States Patent
Kim et al.

(10) Patent No.: US 12,074,264 B2
(45) Date of Patent: Aug. 27, 2024

(54) DISPLAY DEVICE AND METHOD OF MANUFACTURING THE SAME

(71) Applicant: Samsung Display Co., Ltd., Yongin-si (KR)

(72) Inventors: Dae Hyun Kim, Hwaseong-si (KR); Hyun Min Cho, Seoul (KR); Keun Kyu Song, Seongnam-si (KR); Je Won Yoo, Bucheon-si (KR); Bek Hyun Lim, Hwaseong-si (KR); Sung Chan Jo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 907 days.

(21) Appl. No.: 17/258,145

(22) PCT Filed: Sep. 20, 2018

(86) PCT No.: PCT/KR2018/011119
§ 371 (c)(1),
(2) Date: Jan. 5, 2021

(87) PCT Pub. No.: WO2020/009273
PCT Pub. Date: Jan. 9, 2020

(65) Prior Publication Data
US 2021/0280753 A1    Sep. 9, 2021

(30) Foreign Application Priority Data
Jul. 6, 2018  (KR) .......................... 10-2018-0079010

(51) Int. Cl.
*H01L 25/16* (2023.01)
*H01L 33/54* (2010.01)
(Continued)

(52) U.S. Cl.
CPC ............ *H01L 33/54* (2013.01); *H01L 25/167* (2013.01); *H01L 33/62* (2013.01); *H01L 33/20* (2013.01);
(Continued)

(58) Field of Classification Search
CPC .............. H01L 25/0753; H01L 25/167; H01L 2933/0066; H01L 33/20; H01L 33/54; H01L 33/56
See application file for complete search history.

(56) References Cited

U.S. PATENT DOCUMENTS 9,006,766 B2    4/2015   Kojima et al.
2011/0089850 A1    4/2011   Shibata et al.
(Continued)

FOREIGN PATENT DOCUMENTS

CN    105655377 A    6/2016
CN    107611153 A    1/2018
(Continued)

OTHER PUBLICATIONS

Chinese Office Action dated Jan. 3, 2024 issued in corresponding Chinese Patent Application No. 201880095430.2 (6 pages).
(Continued)

*Primary Examiner* — Jaehwan Oh
(74) *Attorney, Agent, or Firm* — Lewis Roca Rothgerber Christie LLP

(57) ABSTRACT

A display device and a method of manufacturing a display device are provided. The display device comprises a first electrode, a second electrode facing the first electrode, a first insulating layer disposed on the first electrode and the second electrode and positioned between the first electrode and the second electrode, a light emitting element disposed on the first insulating layer, a first passivation layer covering the light emitting element and exposing both end portions of
(Continued)

the light emitting element, an organic insulating layer disposed on the first passivation layer, a first contact electrode electrically connected to the first electrode, disposed on the organic insulating layer and in contact with a first end portion of the light emitting element exposed by the first passivation layer, and a second contact electrode electrically connected to the second electrode, disposed on the organic insulating layer and in contact with a second end portion of the light emitting element exposed by the first passivation layer.

20 Claims, 32 Drawing Sheets

(51) Int. Cl.
    *H01L 33/62*  (2010.01)
    *H01L 33/20*  (2010.01)
    *H01L 33/56*  (2010.01)
(52) U.S. Cl.
    CPC ...... *H01L 33/56* (2013.01); *H01L 2933/0066* (2013.01)

(56) References Cited

U.S. PATENT DOCUMENTS

| | | |
|---|---|---|
| 2011/0254043 A1 | 10/2011 | Negishi et al. |
| 2013/0320382 A1 | 12/2013 | Kojima et al. |
| 2014/0145237 A1 | 5/2014 | Do et al. |
| 2014/0151720 A1 | 6/2014 | Lan et al. |
| 2016/0155785 A1 | 6/2016 | Sato |
| 2016/0211245 A1 | 7/2016 | Do |
| 2017/0098740 A1 | 4/2017 | Ohmae et al. |
| 2017/0207416 A1 | 7/2017 | Kim et al. |
| 2017/0279084 A1 | 9/2017 | Sakamoto et al. |
| 2017/0294424 A1 | 10/2017 | Jeong |
| 2017/0317228 A1 | 11/2017 | Sung |
| 2017/0338372 A1 | 11/2017 | Teraguchi et al. |
| 2018/0012876 A1 | 1/2018 | Kim et al. |
| 2018/0019369 A1 | 1/2018 | Cho et al. |
| 2018/0175009 A1 | 6/2018 | Kim et al. |
| 2018/0175104 A1* | 6/2018 | Kang ................... H01L 33/005 |
| 2018/0175106 A1* | 6/2018 | Kim ....................... H01L 33/60 |
| 2018/0218668 A1 | 8/2018 | Aoyagi et al. |
| 2020/0295223 A1 | 9/2020 | Cho et al. |
| 2021/0391496 A1 | 12/2021 | Cho et al. |

FOREIGN PATENT DOCUMENTS

| | | |
|---|---|---|
| CN | 107634081 A | 1/2018 |
| CN | 108206228 A | 6/2018 |
| EP | 3 270 424 A1 | 1/2018 |
| JP | 2012-243849 A | 12/2012 |
| JP | 2014-72215 | 4/2014 |
| JP | 2015-195244 | 11/2015 |
| KR | 10-2012-0122159 A | 11/2012 |
| KR | 10-2012-0122160 A | 11/2012 |
| KR | 10-1436123 B1 | 11/2014 |
| KR | 10-2015-0006798 A | 1/2015 |
| KR | 10-1730977 B1 | 4/2017 |
| KR | 10-2018-0007025 A | 1/2018 |
| KR | 10-2018-0007376 A | 1/2018 |
| KR | 10-2018-0026268 A | 3/2018 |
| KR | 10-2018-0072909 A | 7/2018 |
| TW | 201423991 A | 6/2014 |
| TW | 201614851 A | 4/2016 |
| WO | WO 2015/151798 A1 | 10/2015 |

OTHER PUBLICATIONS

International Search Report corresponding to PCT/KR2018/011119, dated Apr. 19, 2019, 5 pages.
Taiwanese Office Action dated Feb. 8, 2023 issued in corresponding Taiwanese Patent Application No. 108123866 (5 pages).

* cited by examiner

[Fig. 1]
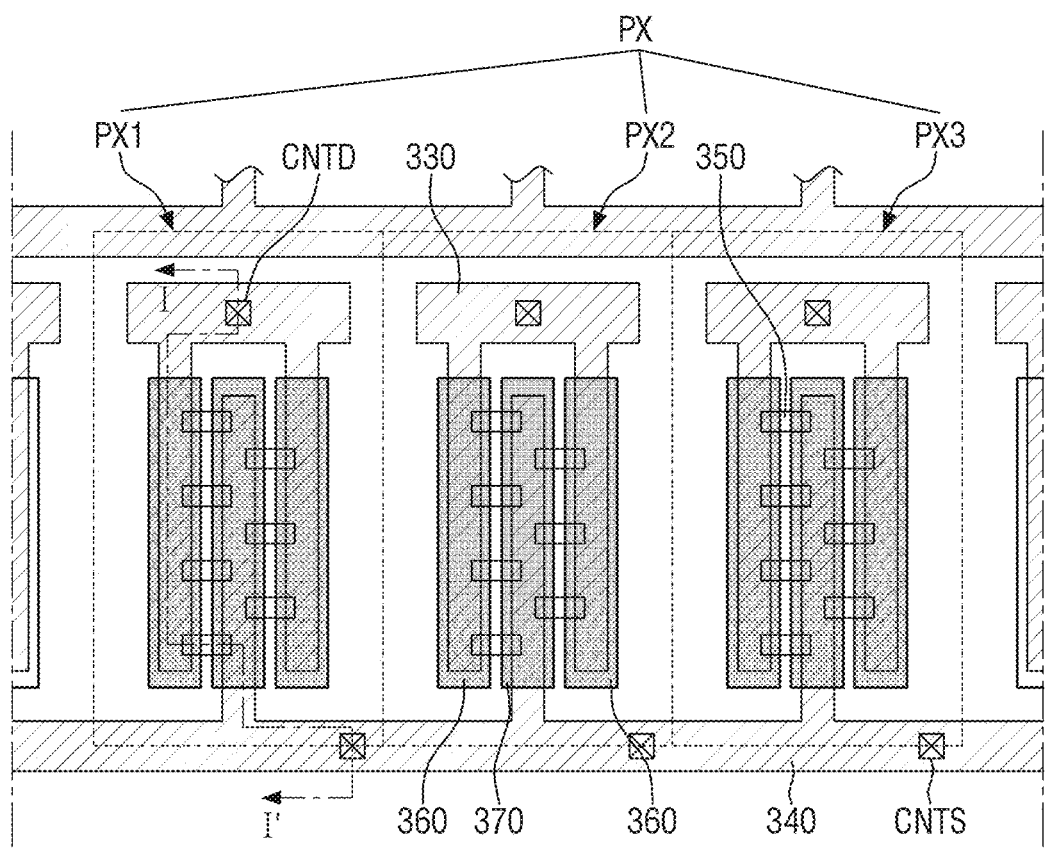

[Fig. 2]
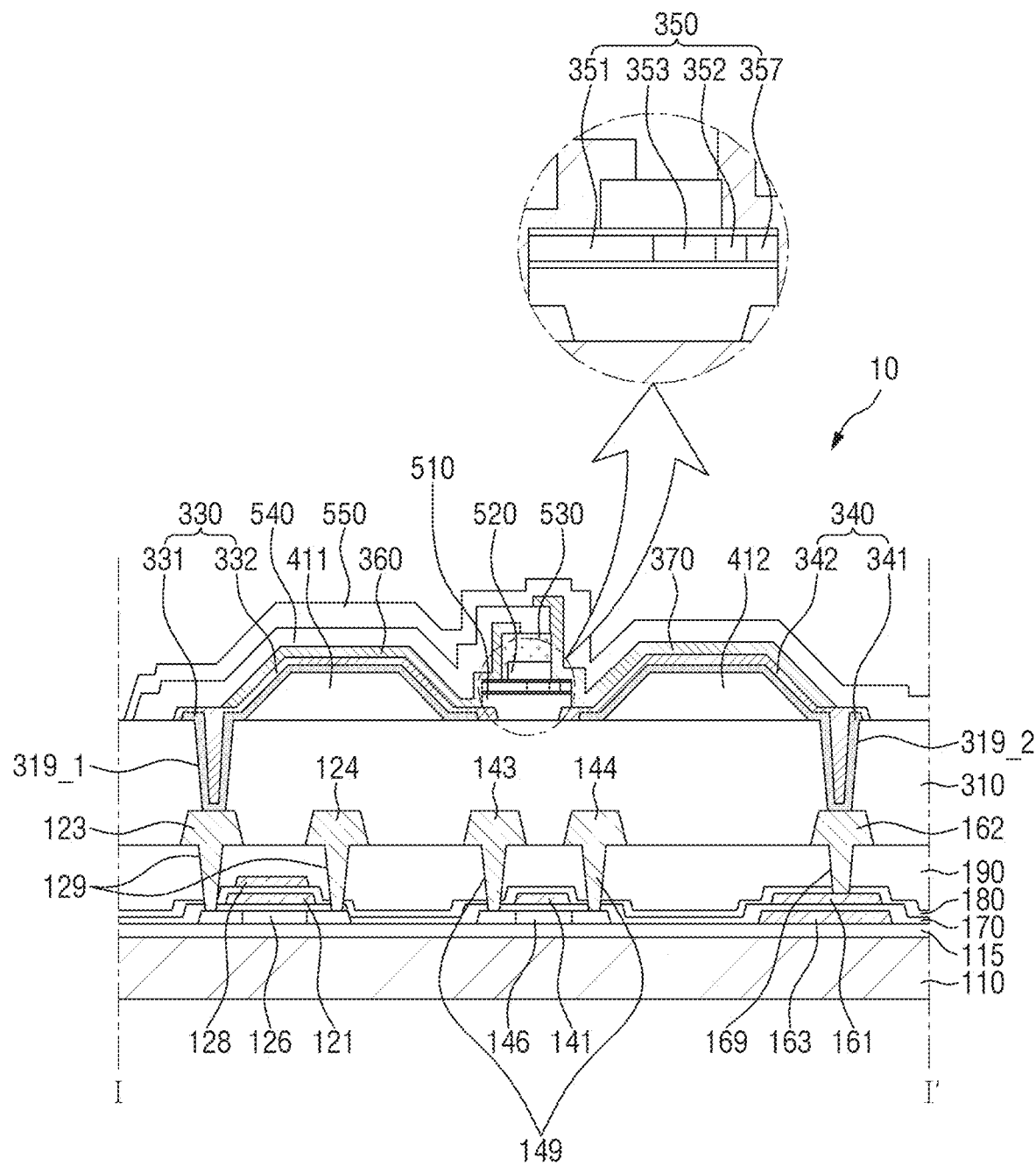

[Fig. 3]
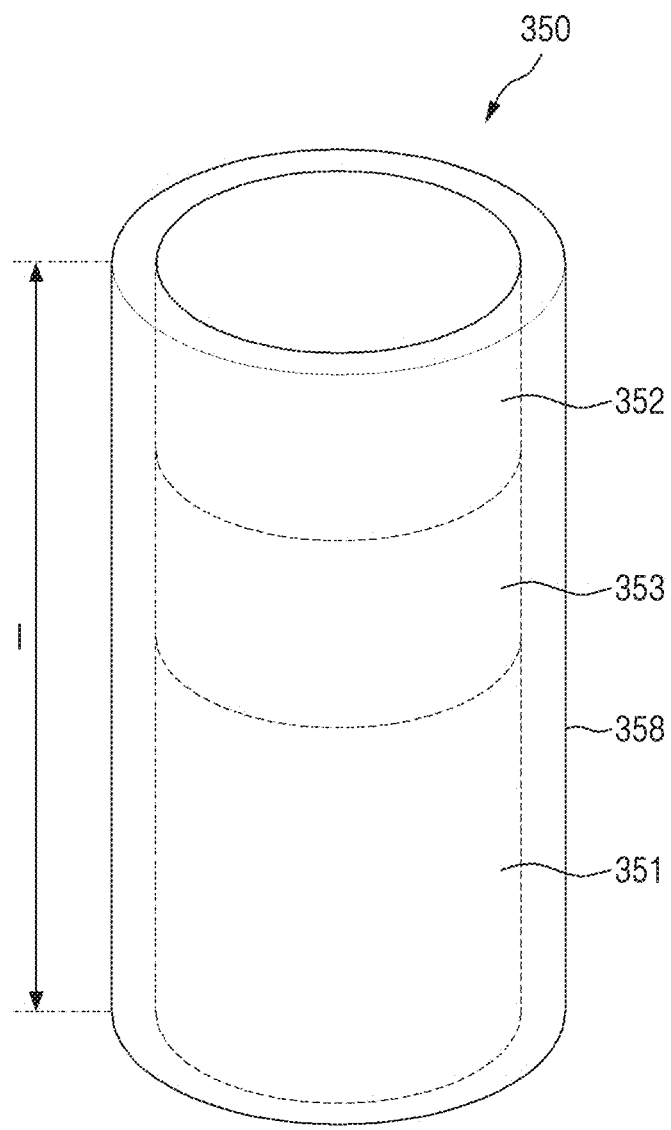

[Fig. 4]
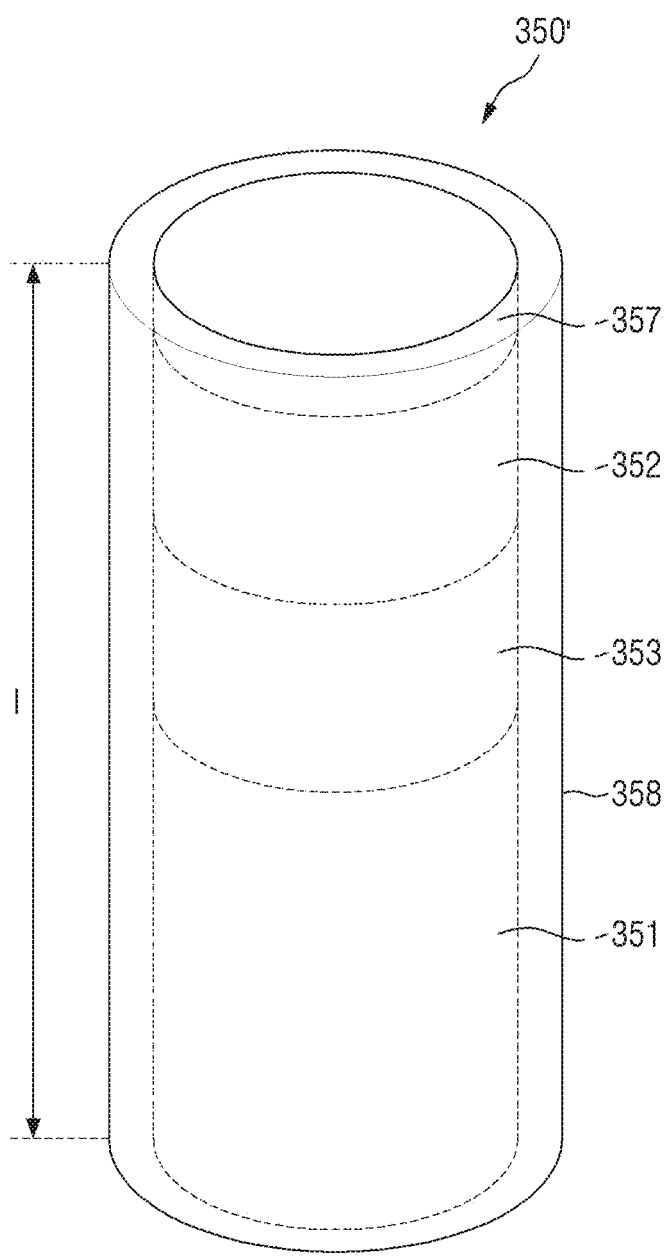

[Fig. 5]
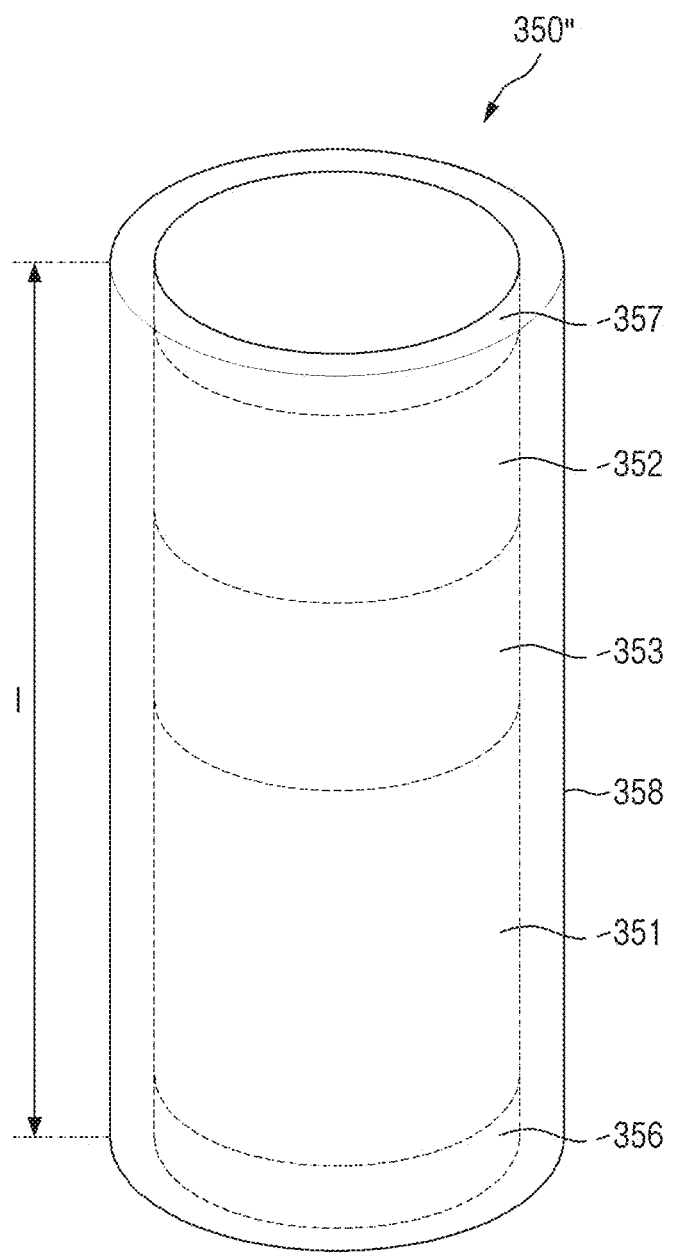

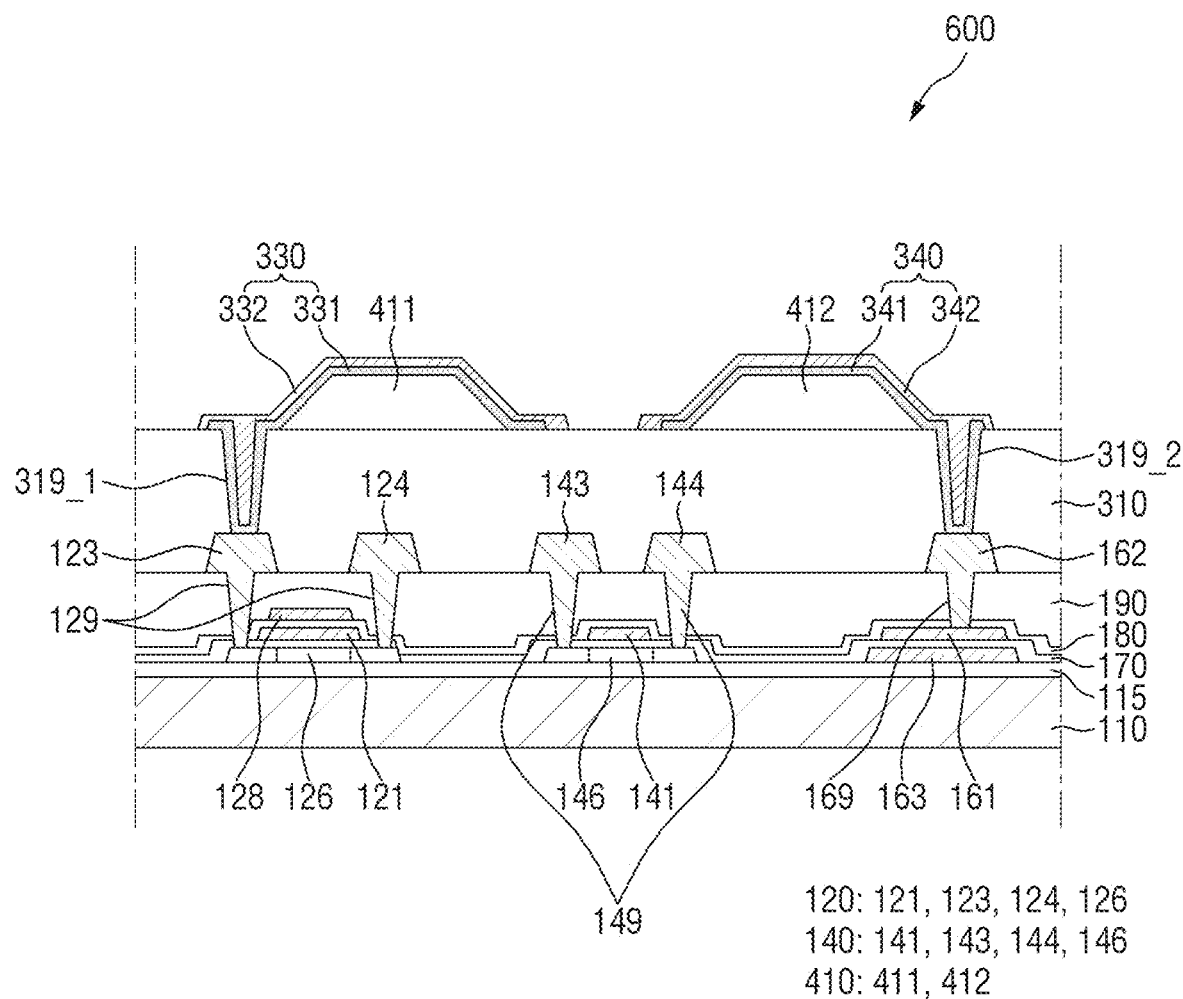
[Fig. 6]

[Fig. 7]
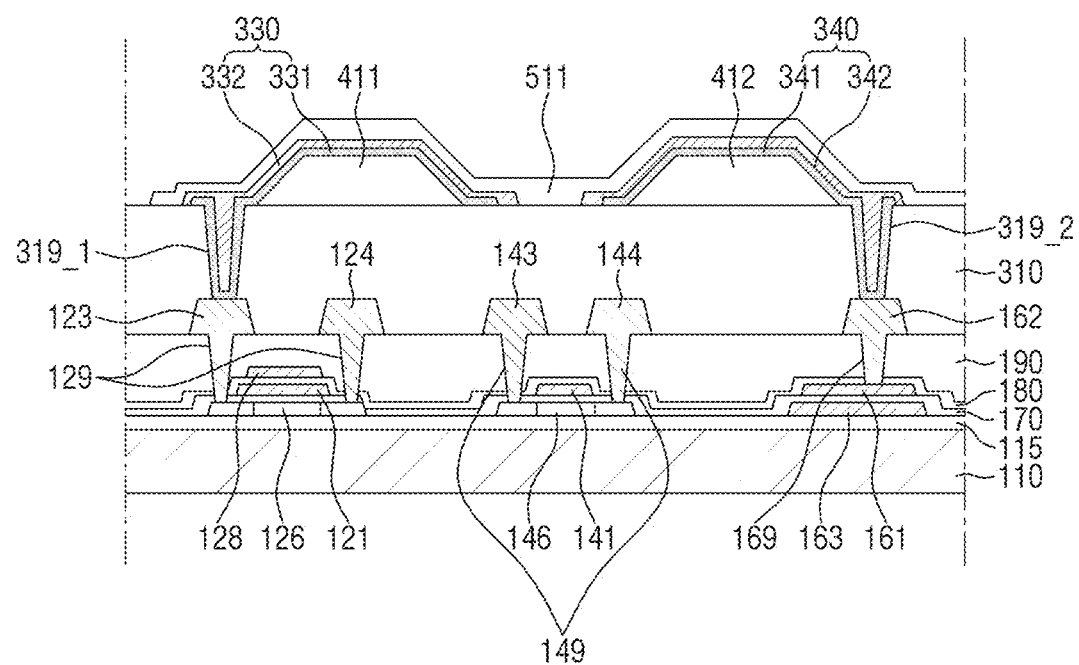

[Fig. 8]
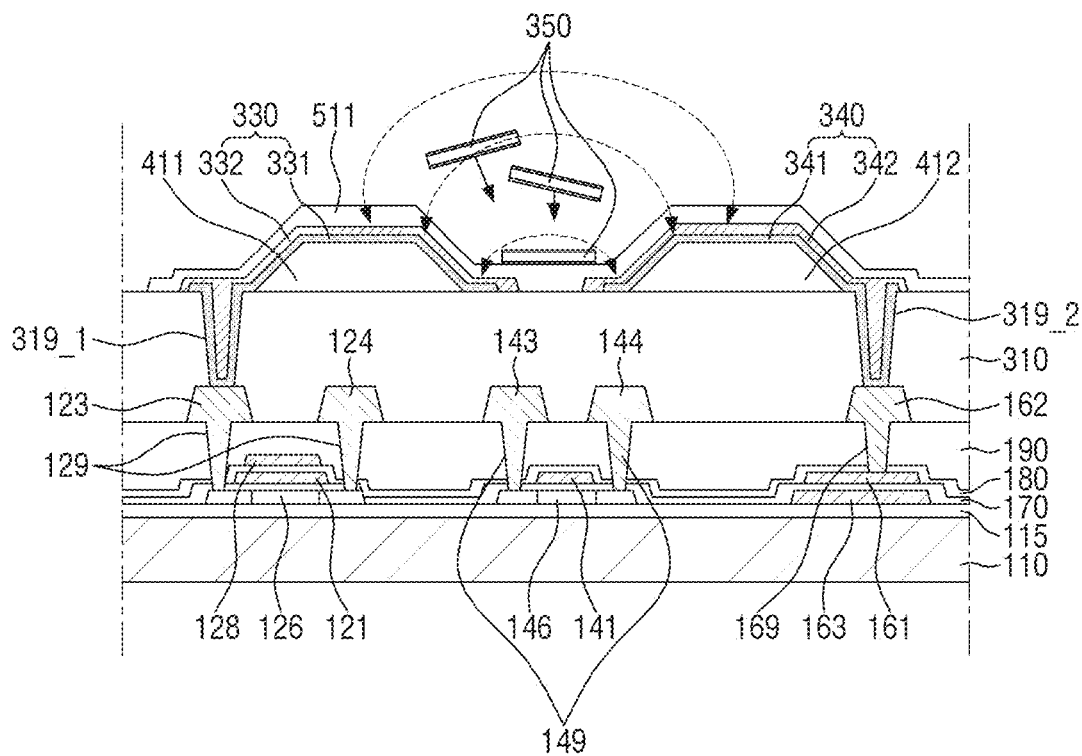
[Fig. 9]
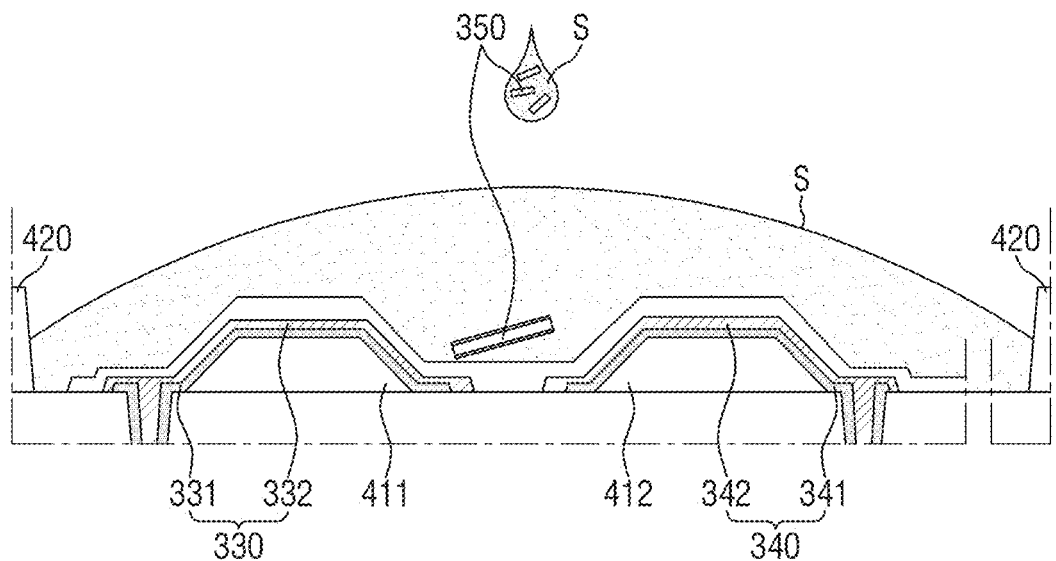

[Fig. 10]
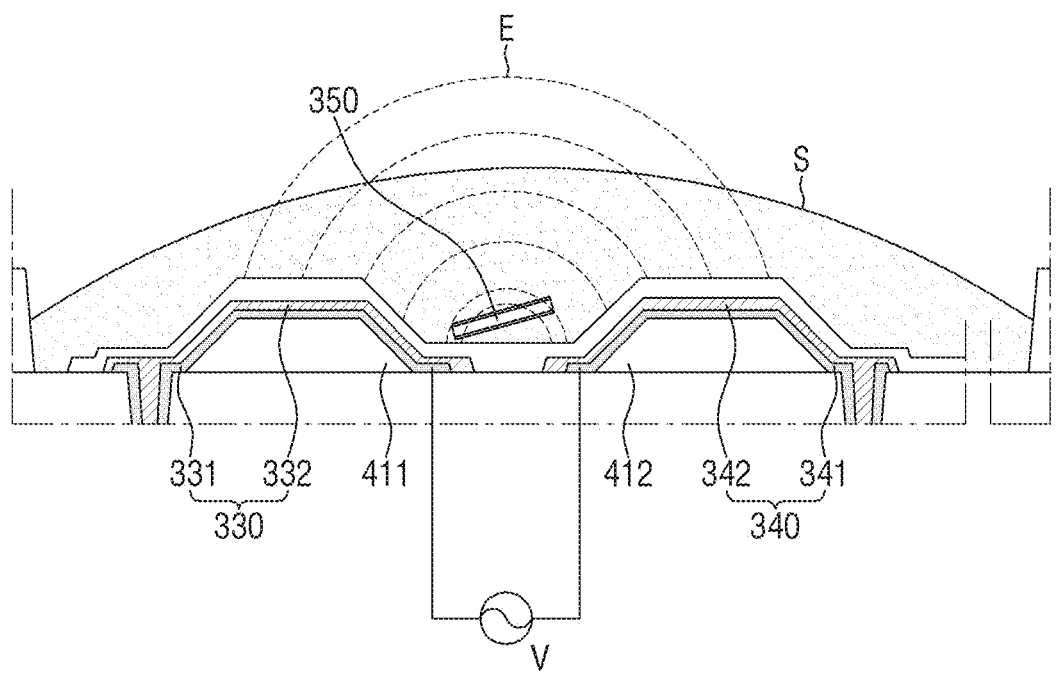
[Fig. 11]
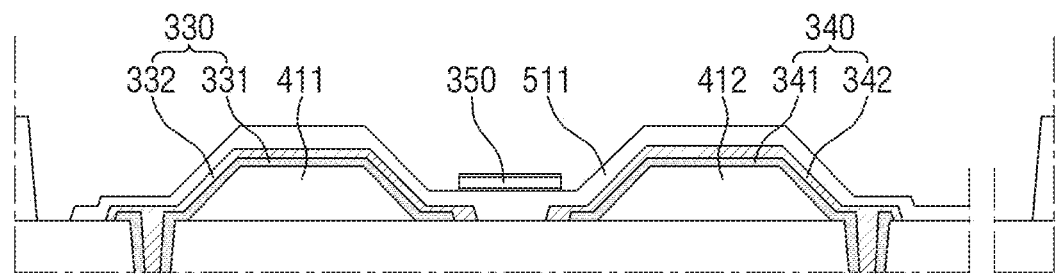

[Fig. 12]
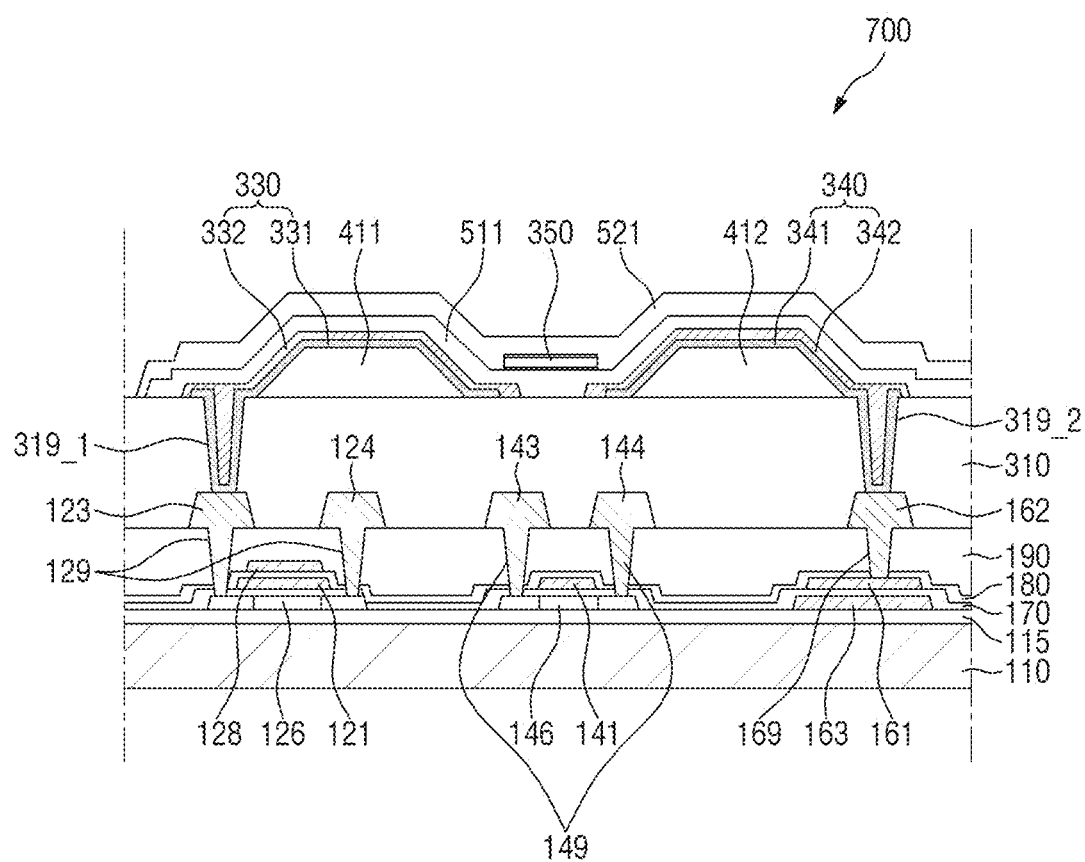

[Fig. 13]
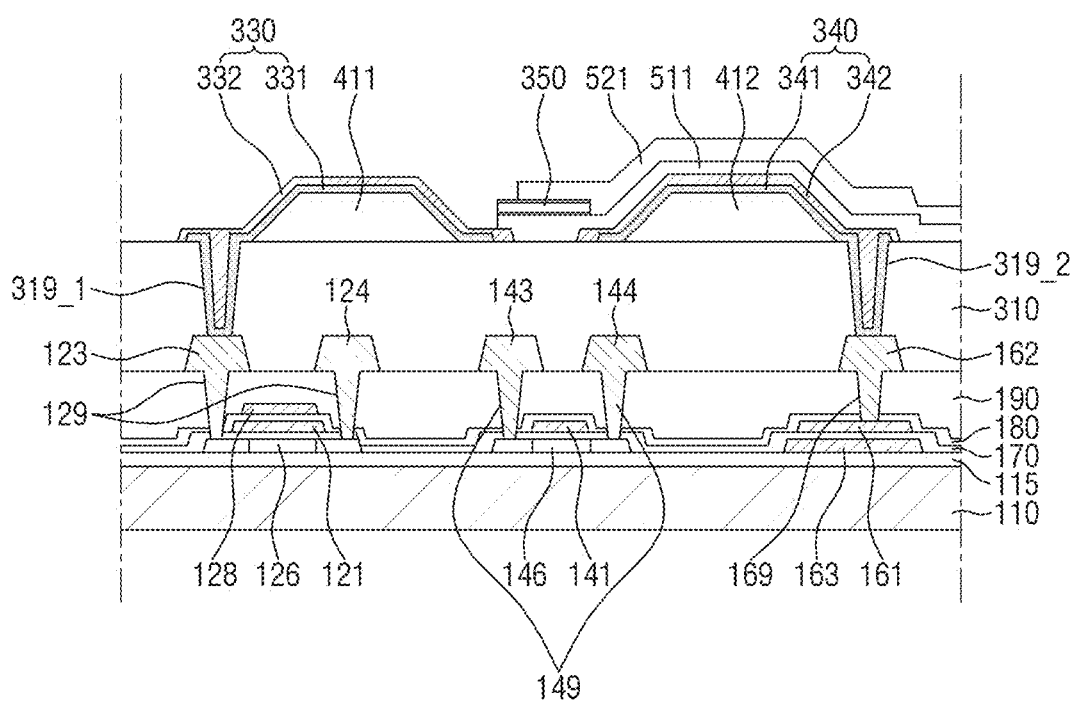

[Fig. 14]
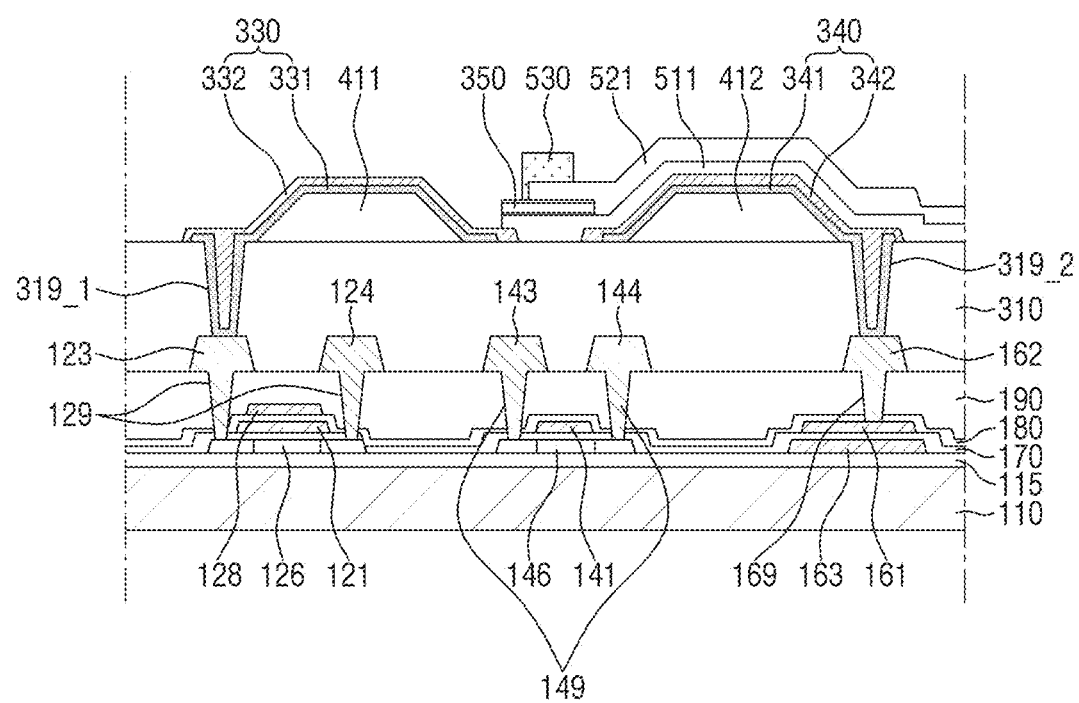

[Fig. 15]
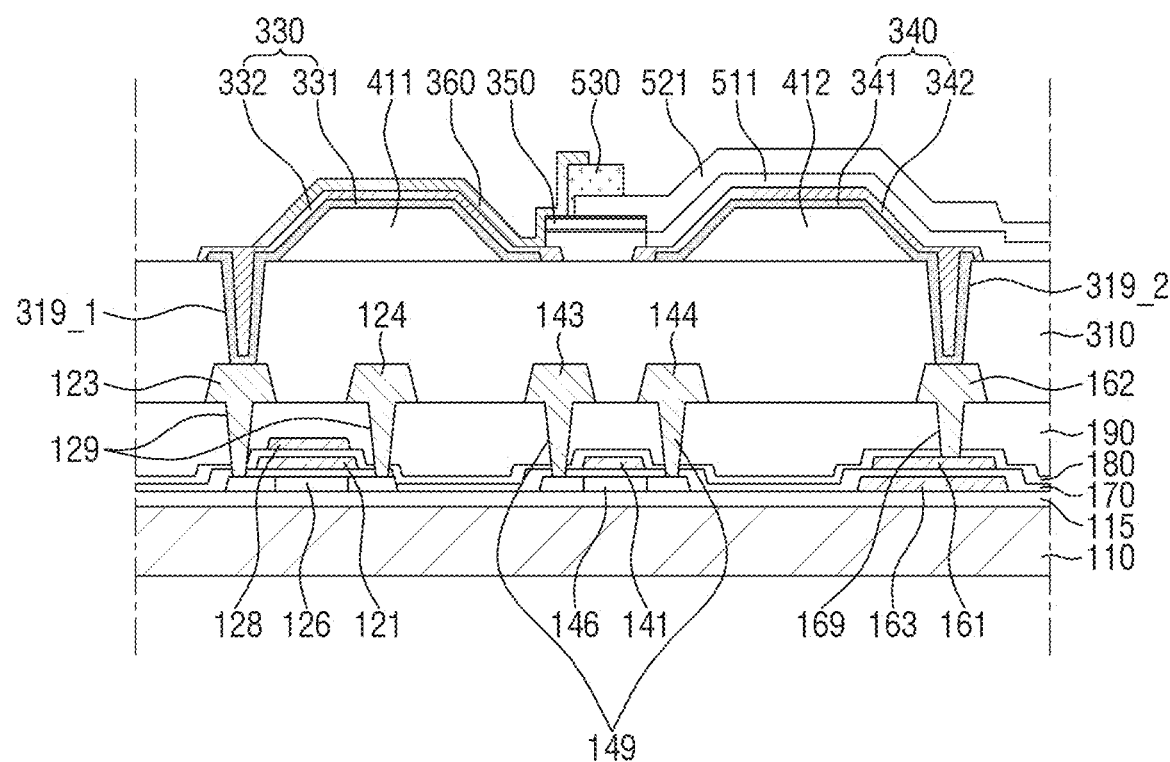

[Fig. 16]
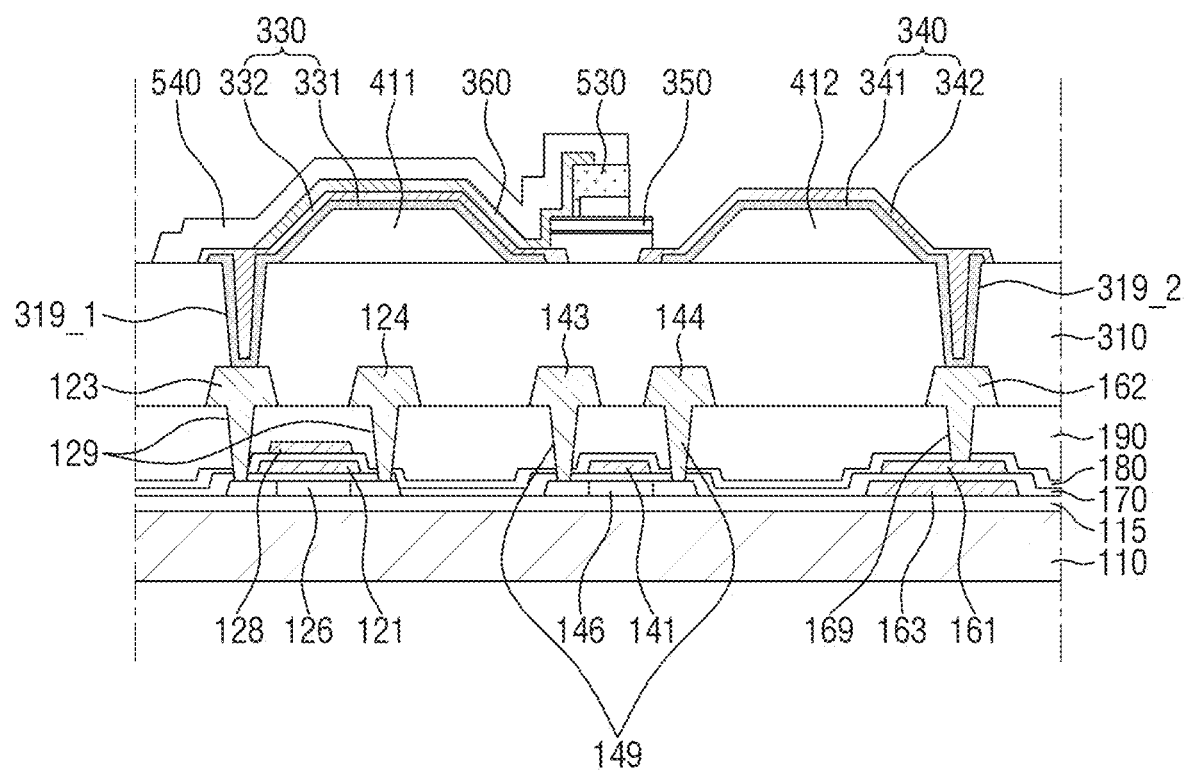

[Fig. 17]
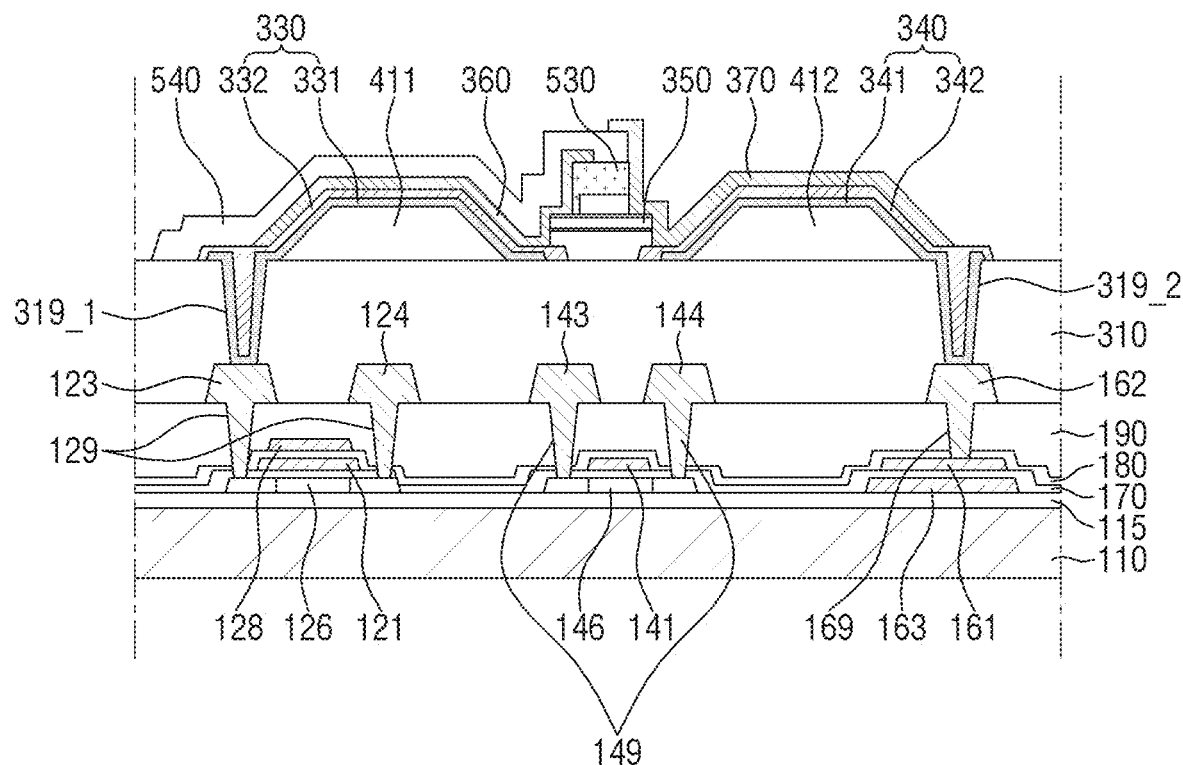
[Fig. 18]
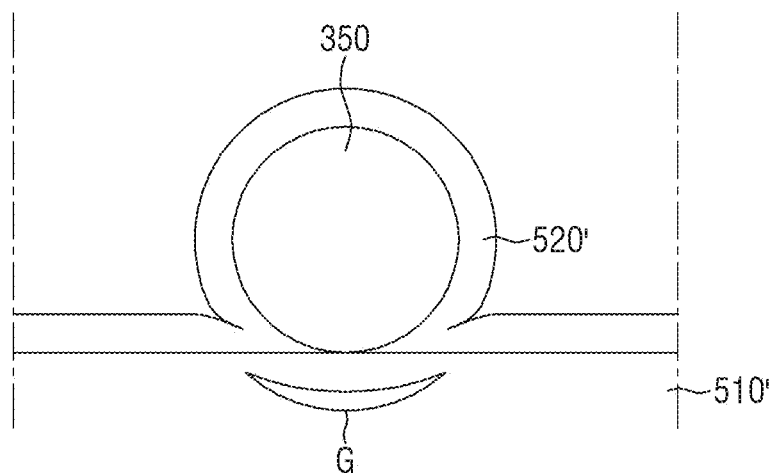

[Fig. 19]
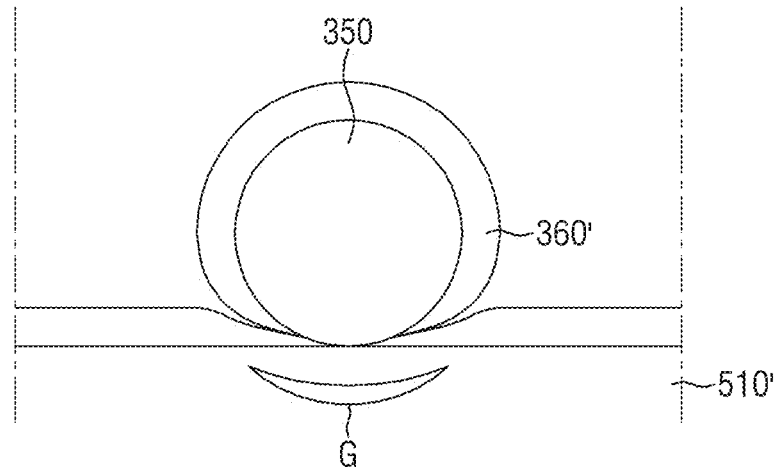
[Fig. 20]
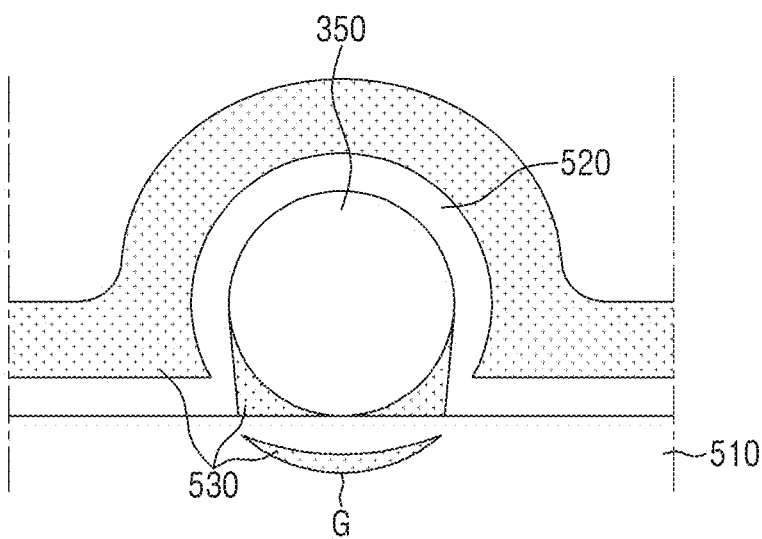

[Fig. 21]
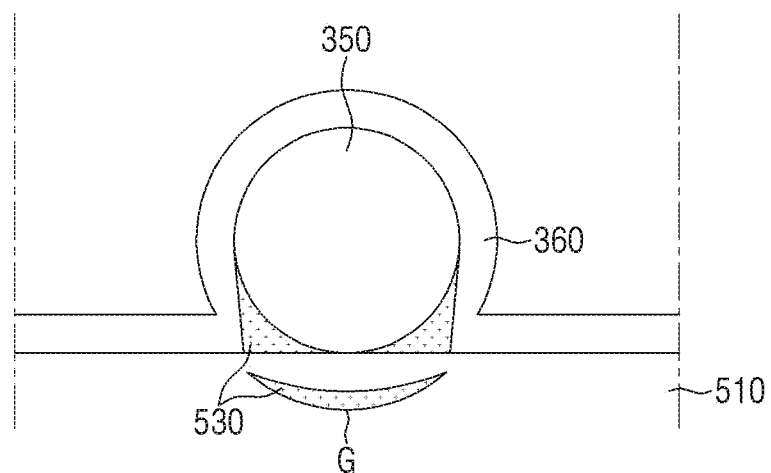
[Fig. 22]
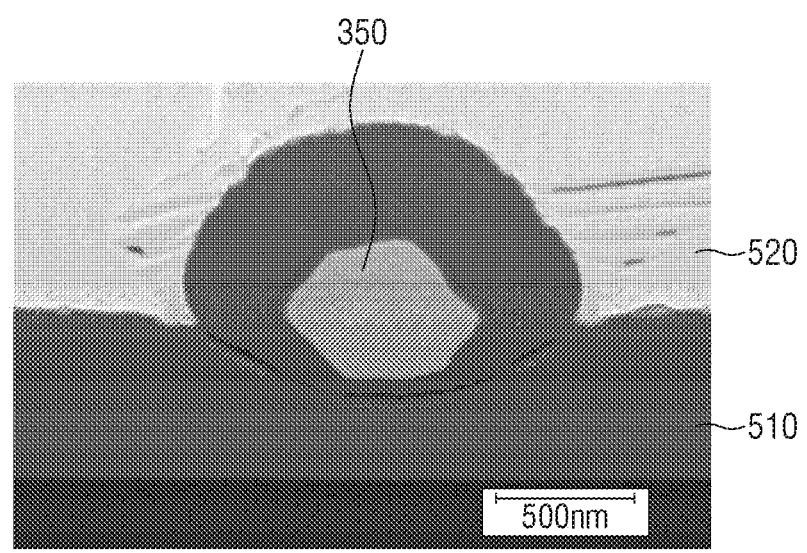

[Fig. 23]
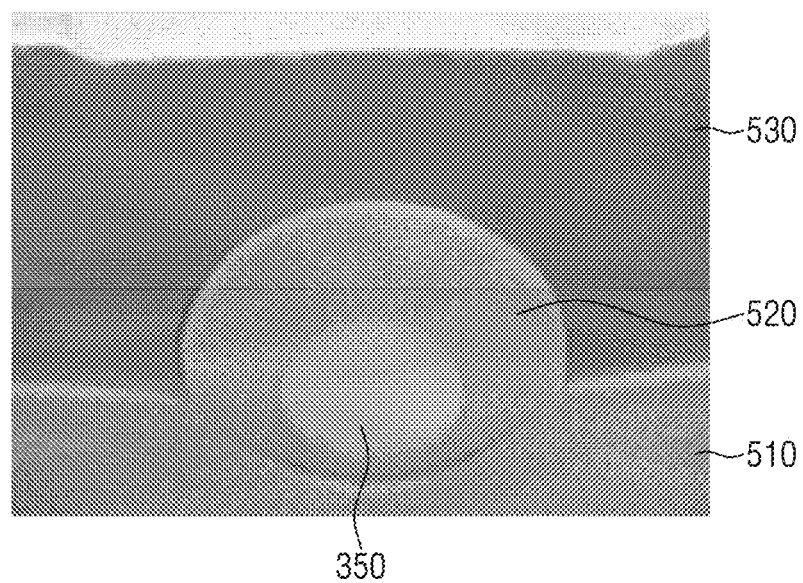

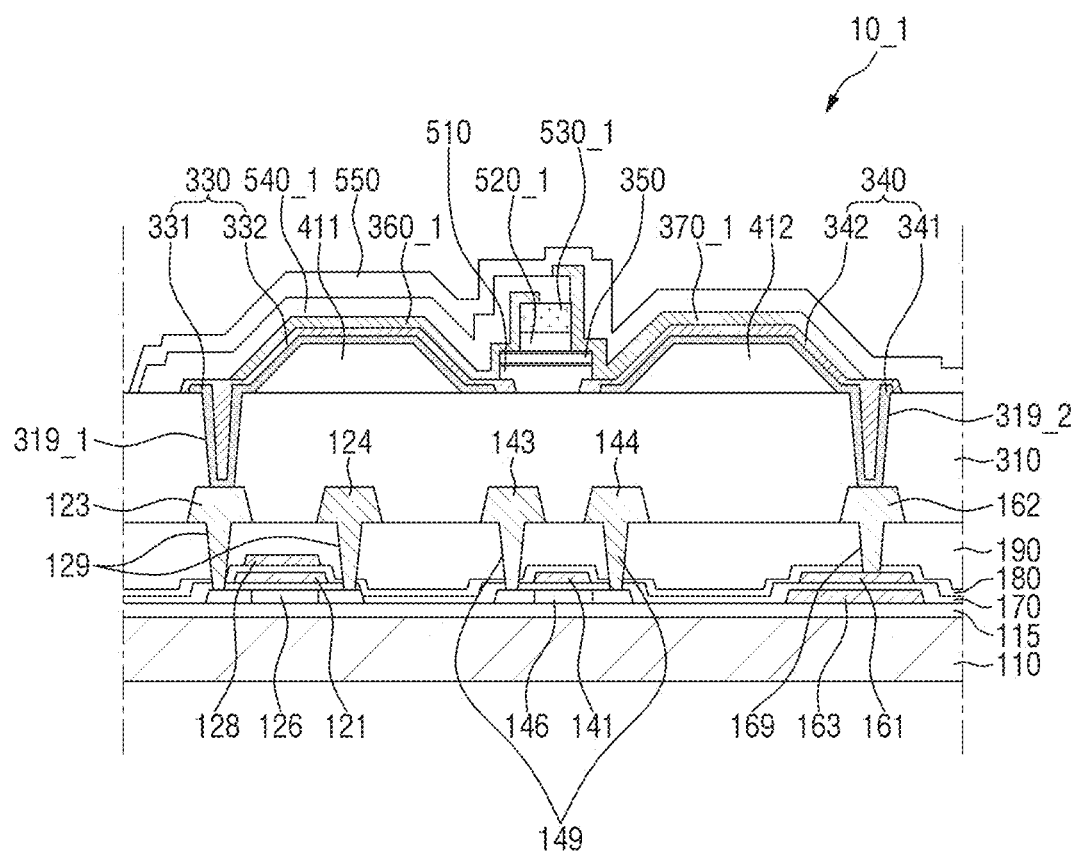
[Fig. 24]

[Fig. 25]
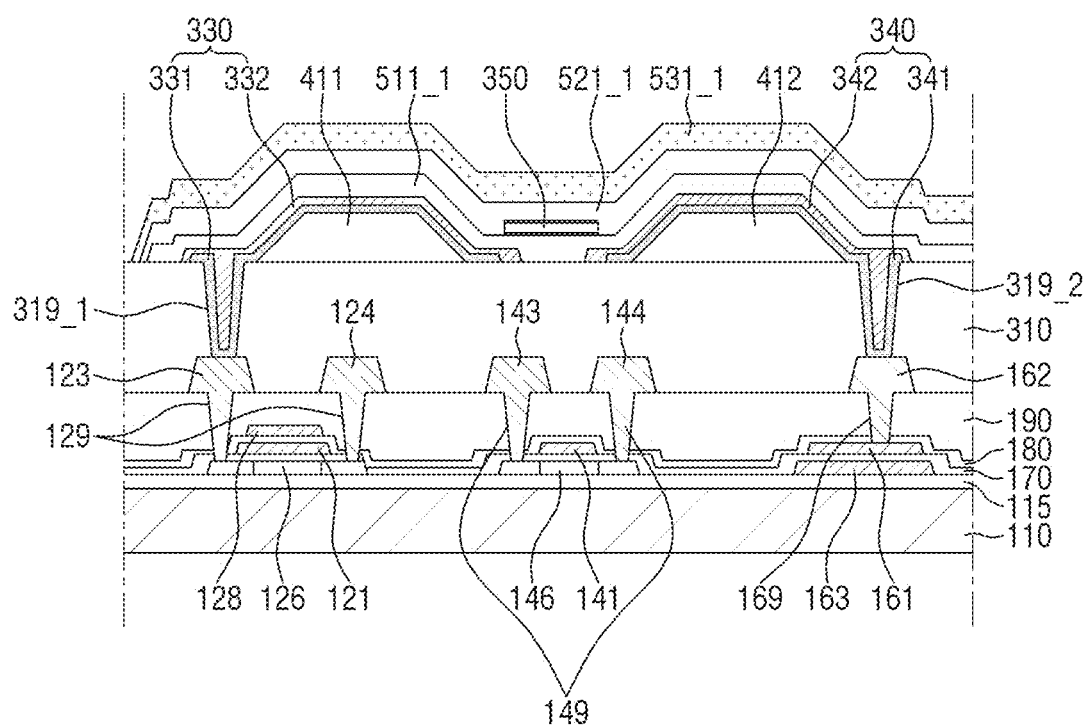

[Fig. 26]
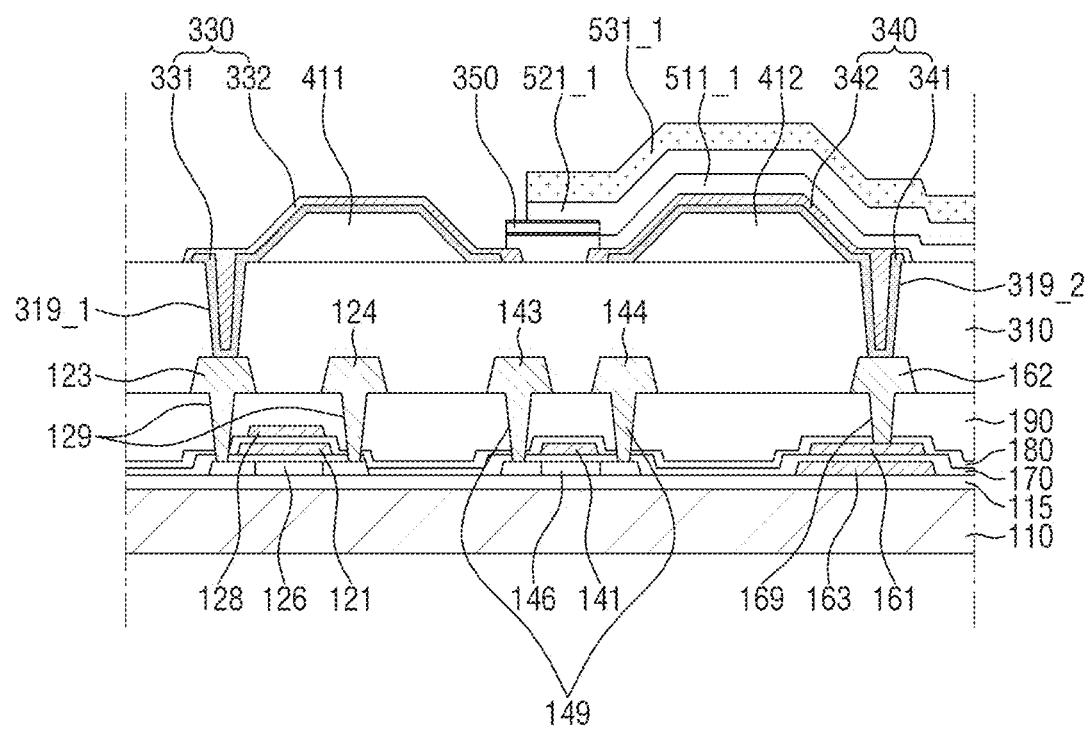

[Fig. 27]
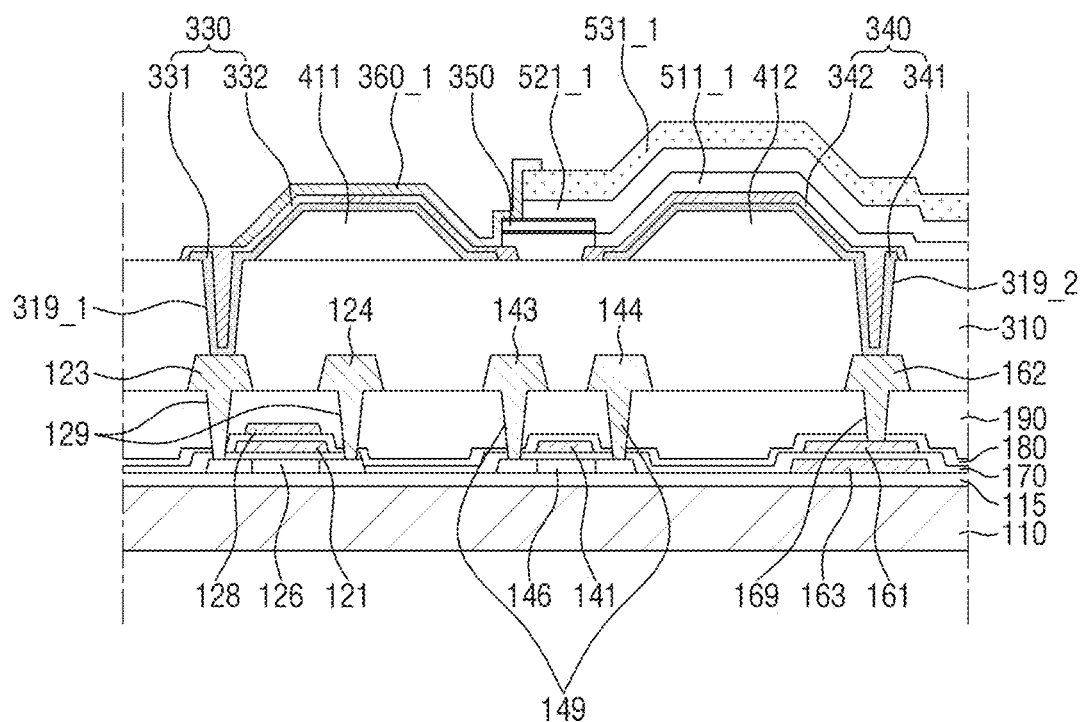

[Fig. 28]
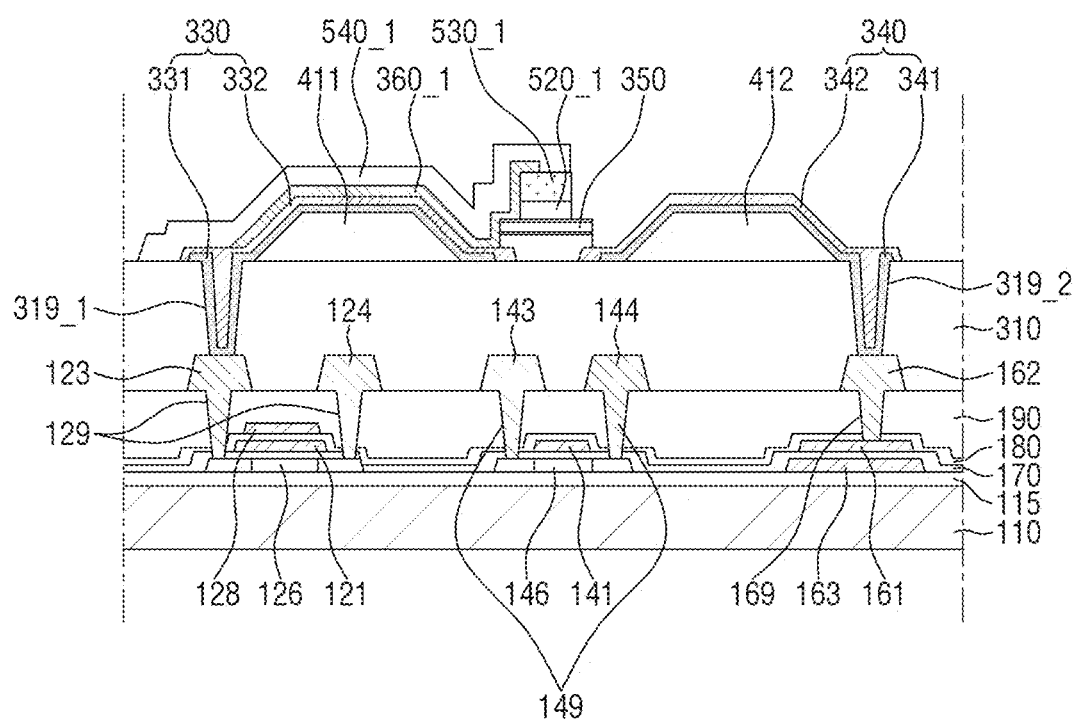

[Fig. 29]
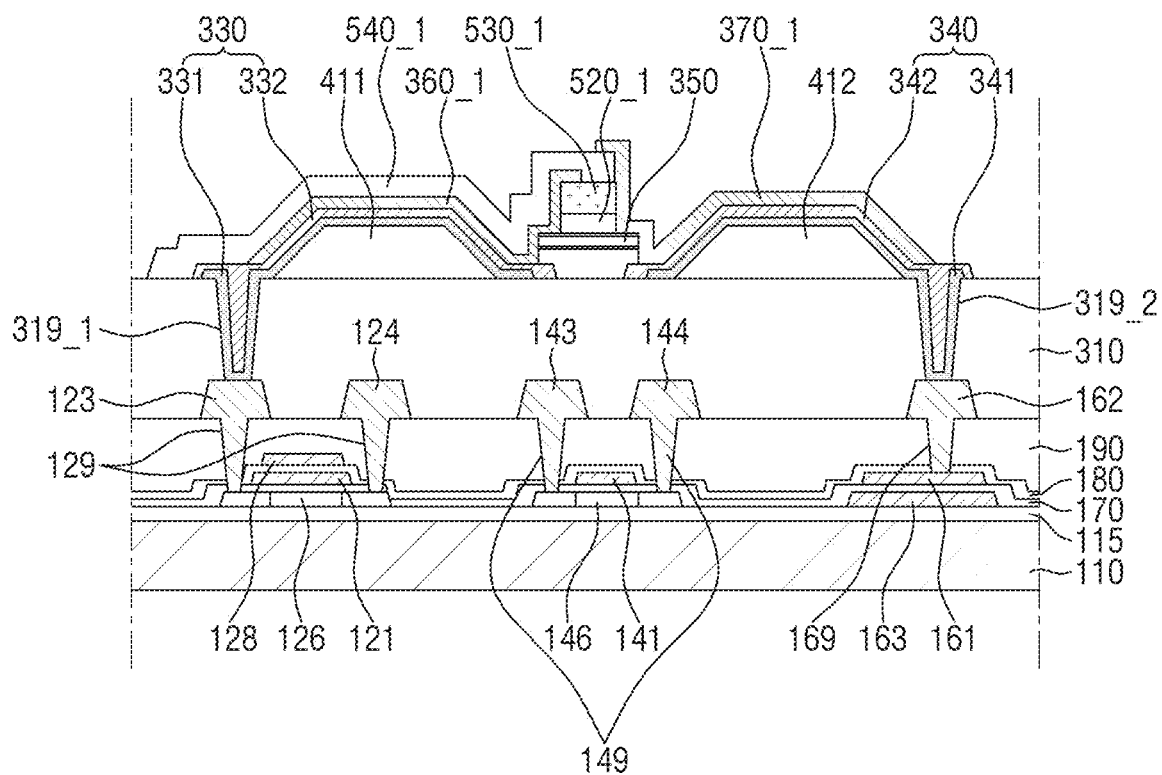

[Fig. 30]
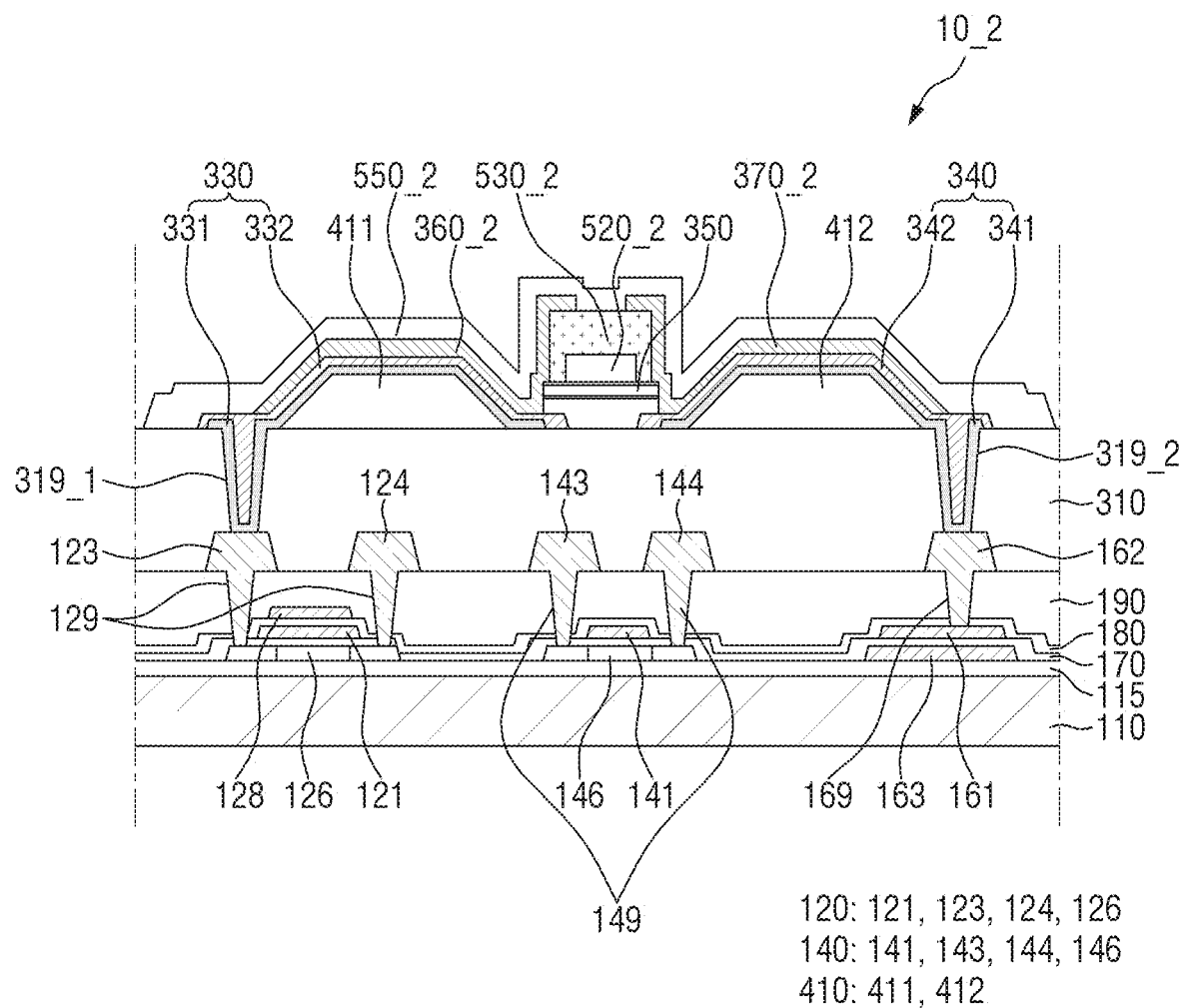

[Fig. 31]
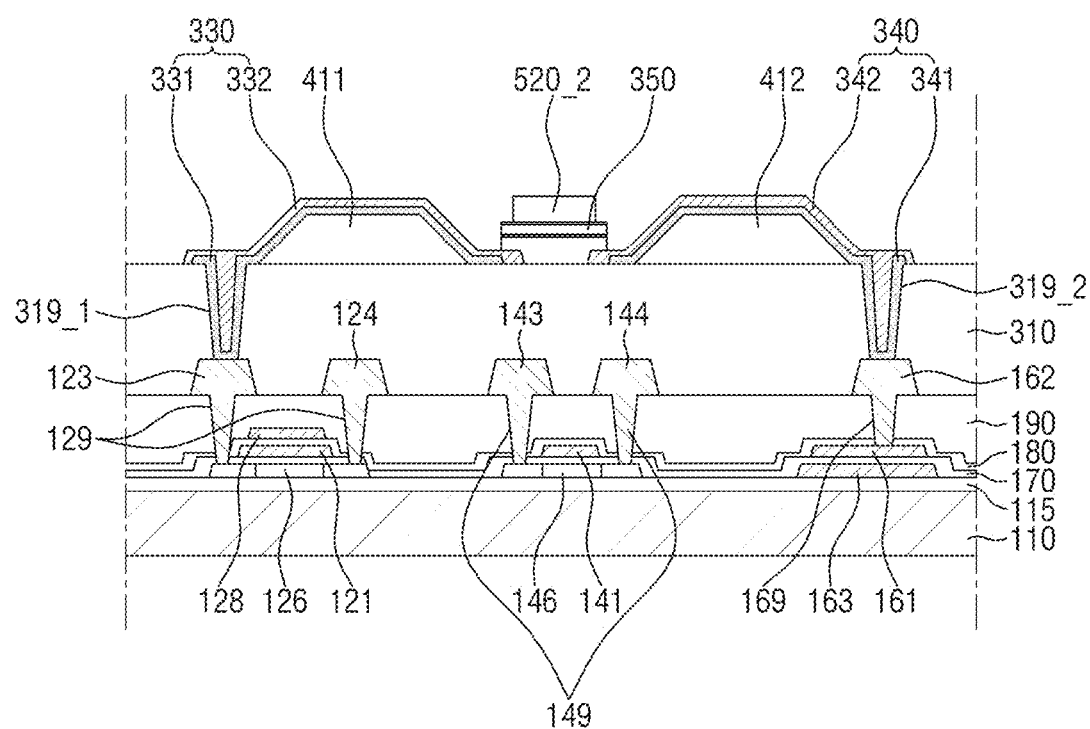

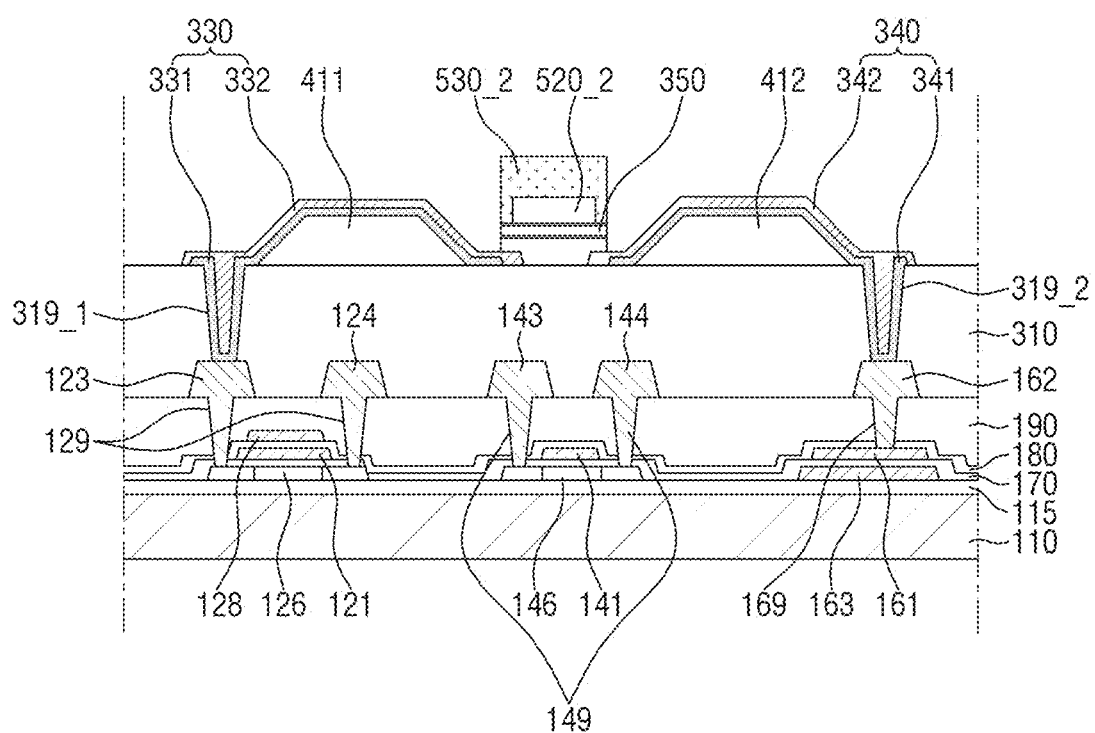
[Fig. 32]

[Fig. 33]
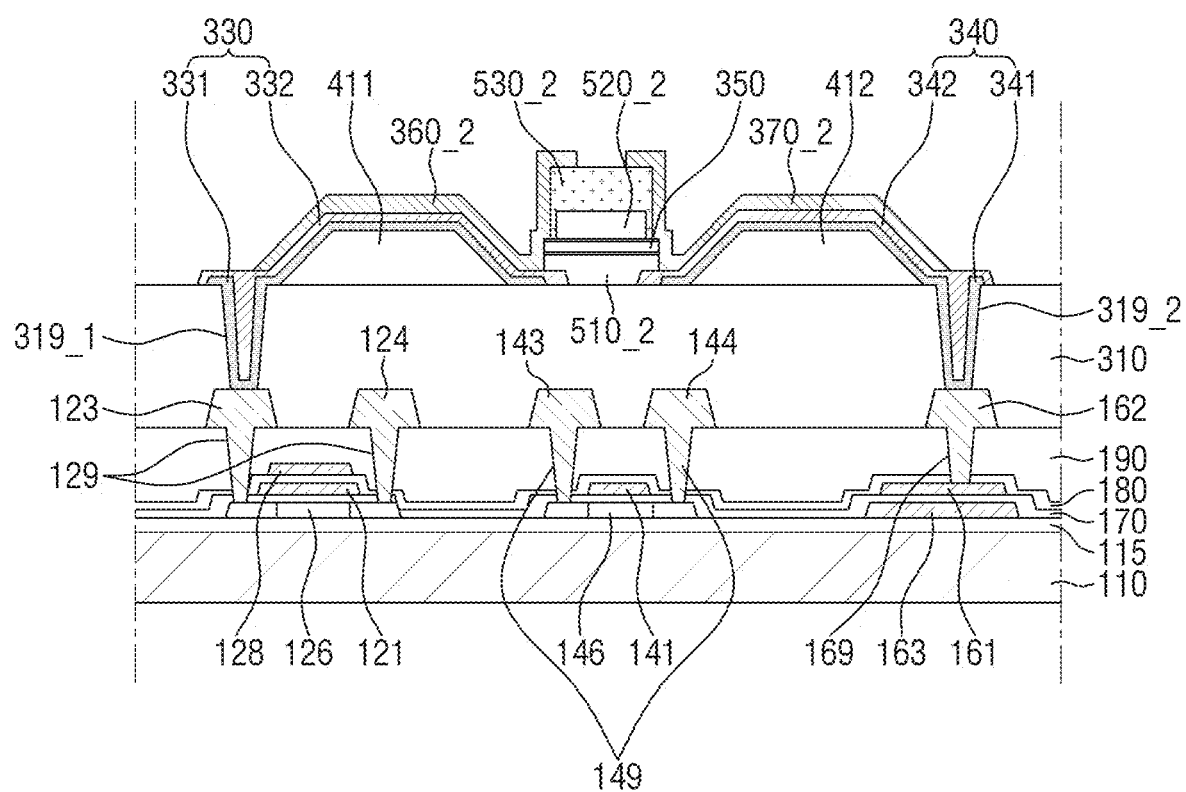

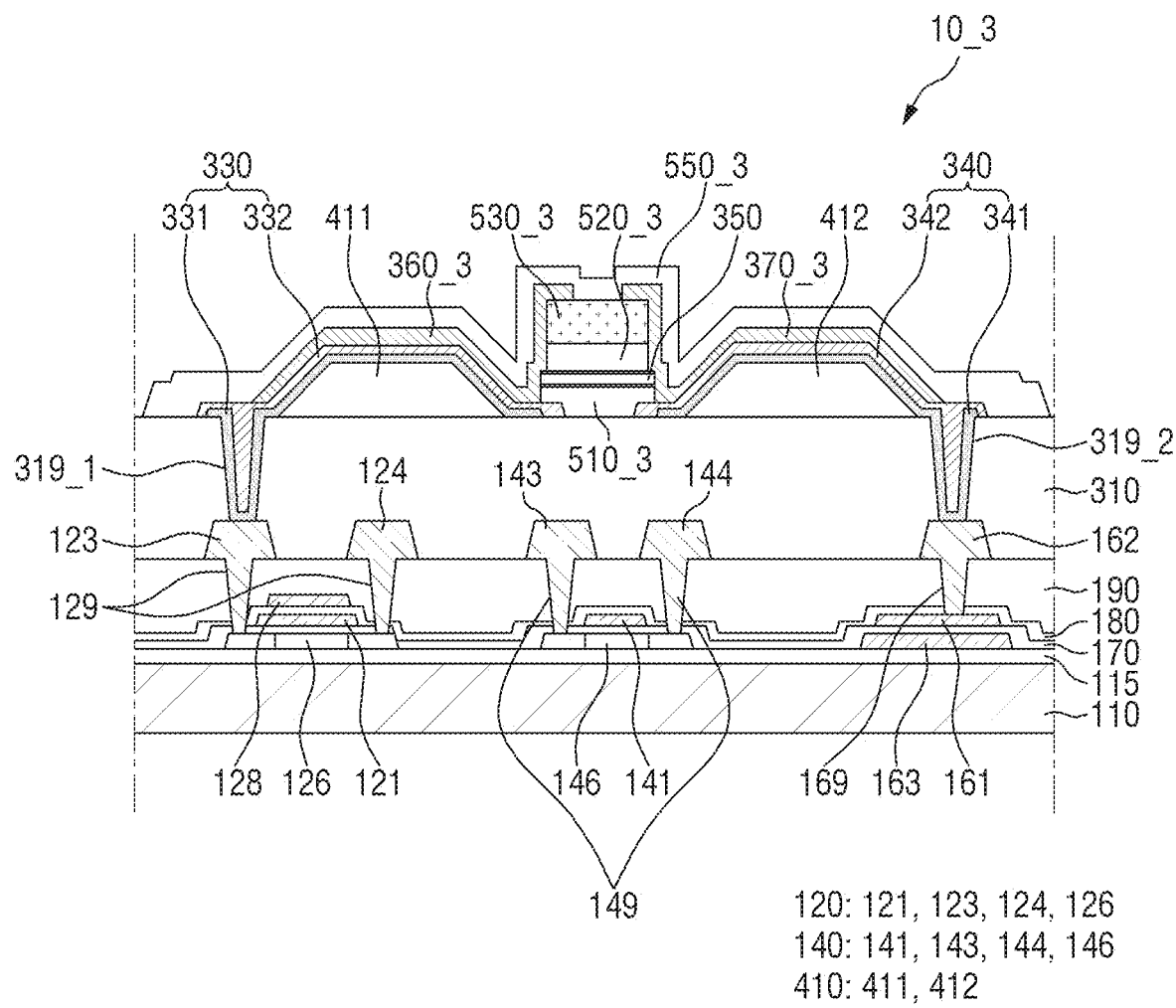
[Fig. 34]

[Fig. 35]
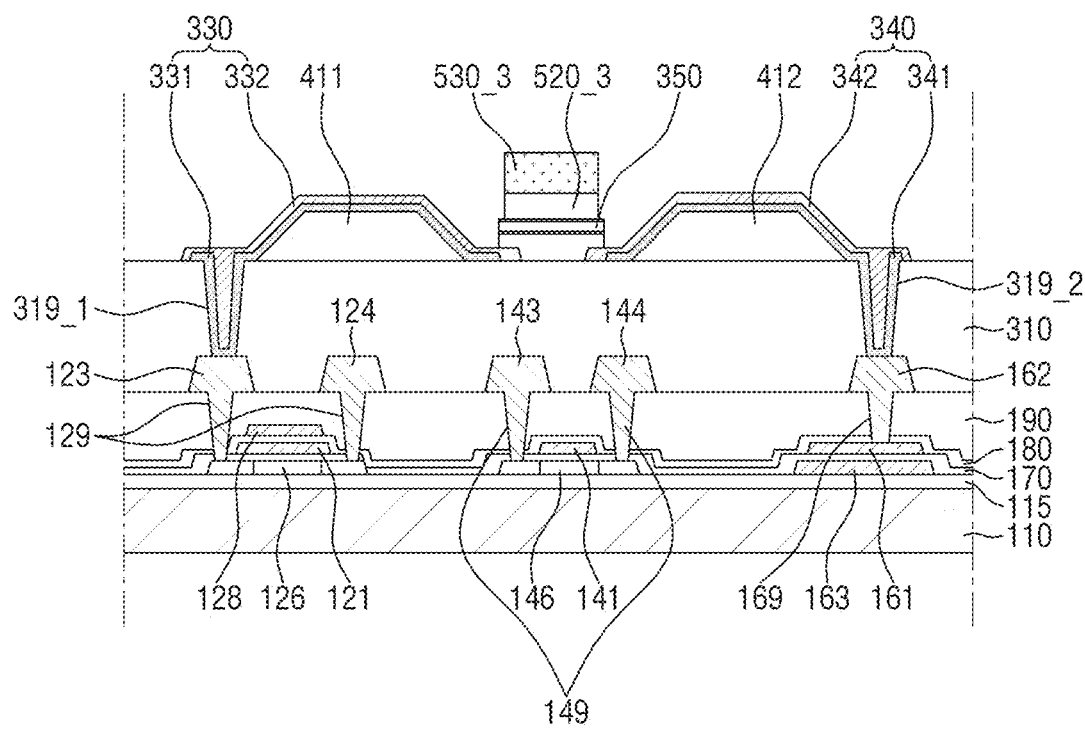

[Fig. 36]
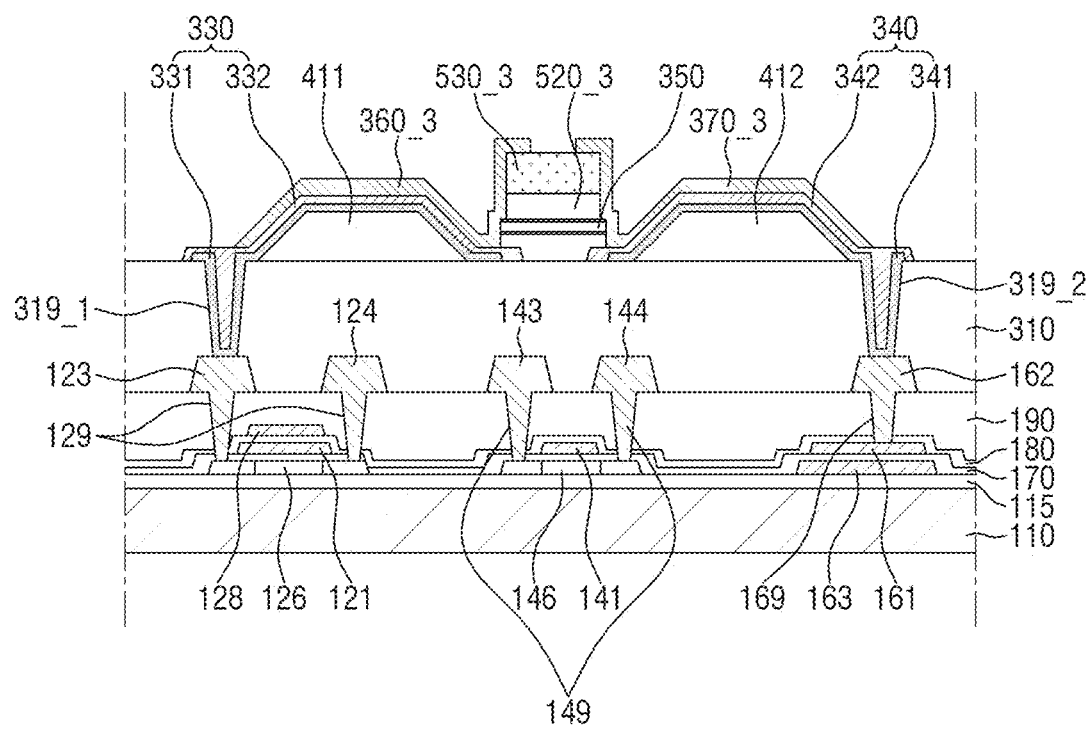

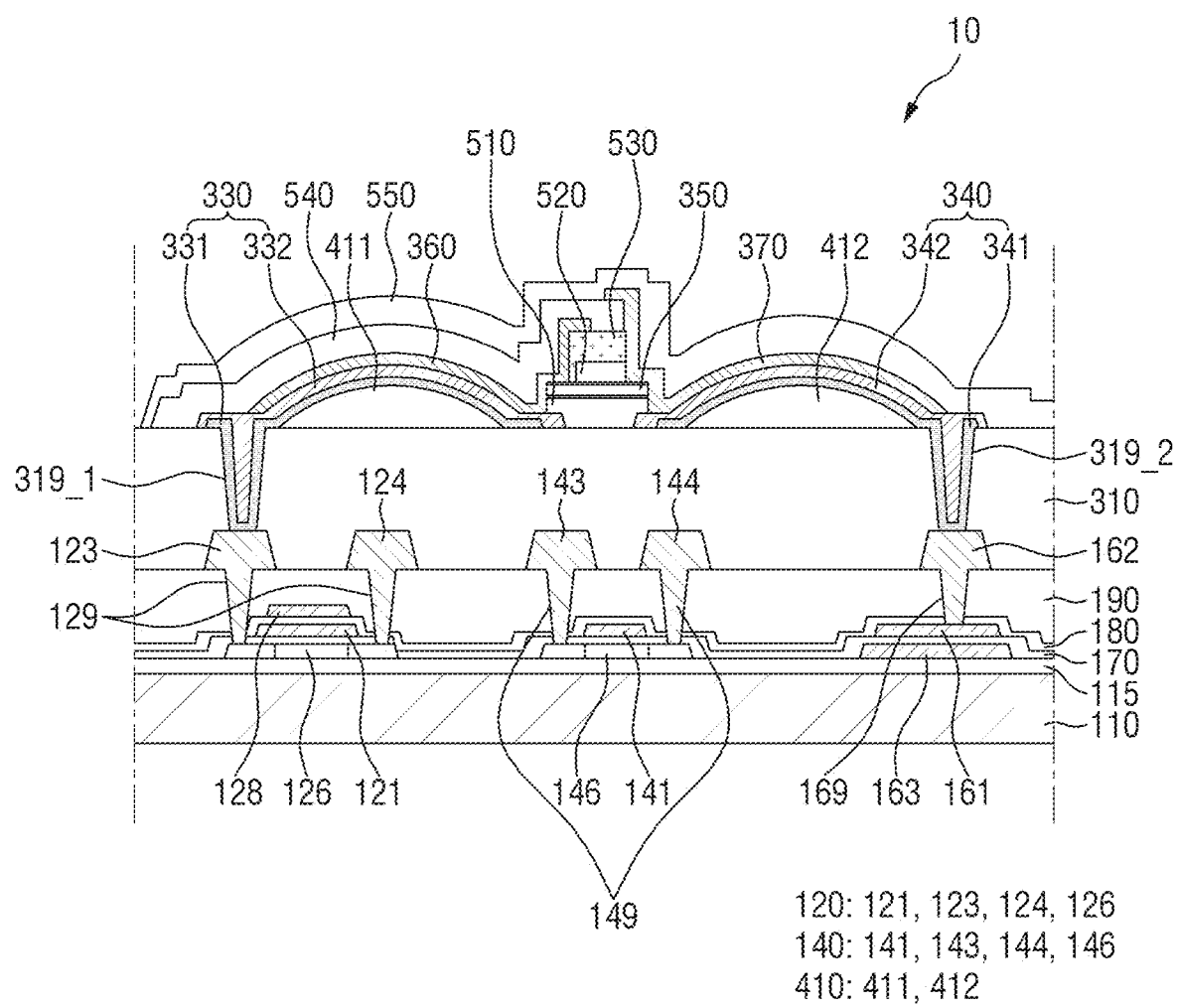
[Fig. 37]

DISPLAY DEVICE AND METHOD OF MANUFACTURING THE SAME

CROSS-REFERENCE TO RELATED APPLICATION

This application is a U.S. National Phase Patent Application of International Patent Application Number PCT/KR2018/011119, filed on Sep. 20, 2018, which claims priority to Korean Patent Application Number 10-2018-0079010, filed on Jul. 6, 2018, the entire content of all of which is incorporated herein by reference.

BACKGROUND

1. Field

The present disclosure relates to a display device and a method of manufacturing the same.

2. Description of Related Art

With the development of multimedia, display devices have become increasingly important. Accordingly, various types of display devices such as an organic light emitting display (OLED) and a liquid crystal display (LCD) have been used.

A display device for displaying an image includes a display panel such as an organic light emitting display panel or a liquid crystal display panel. The light emitting display panel may include a light emitting element. For example, in the case of a light emitting diode (LED), an organic light emitting diode (OLED) using an organic material as a fluorescent material, an inorganic light emitting diode using an inorganic material as a fluorescent material and the like may be mentioned as examples.

The organic light emitting diode (OLED) using an organic material as a fluorescent material of a light emitting element has advantages in that a manufacturing process is simple and a display device can have flexibility. However, it is known that an organic material is vulnerable to a high-temperature operating environment and the blue light efficiency is relatively low.

On the other hand, the inorganic light emitting diode using an inorganic semiconductor as a fluorescent material has advantages in that it has durability even in a high-temperature environment and the blue light efficiency is high compared to the organic light emitting diode. In addition, a transfer method using a dielectrophoresis (DEP) method has been developed in a manufacturing process which has been mentioned as a drawback of a conventional inorganic light emitting diode. Therefore, continuous studies have been conducted on inorganic light emitting diodes having superior durability and efficiency compared with organic light emitting diodes.

Meanwhile, the display device includes a plurality of pixels, and each pixel includes a plurality of light emitting elements, for example, inorganic light emitting diodes. The light emitting elements may be aligned in each pixel and fixed by an insulating layer including an insulating material. The insulating material included in the insulating layer may be an inorganic material, and a crystal defect (seam) may be formed around the light emitting element in the inorganic insulating layer. In addition, a gap may be formed because an inorganic material is not formed up to a space between the light emitting element and a base layer. The defect in the crystal interface or the gap formed below the light emitting element may cause damage to the light emitting element or poor contact with an electrode in an additional process.

SUMMARY

In view of the above, one aspect of the present disclosure provides a display device in which an interface defect of inorganic crystals or a gap formed below a light emitting element is filled with an organic material by forming an organic insulating layer on an inorganic insulating layer.

Another aspect of the present disclosure is to prevent damage to a light emitting element or poor contact with an electrode, which may occur during a manufacturing process of a display device, by eliminating a defect and a gap in an insulating layer covering the light emitting element.

It should be noted that aspects of the present disclosure are not limited to the above-mentioned aspects, and other unmentioned aspects of the present disclosure will be clearly understood by those skilled in the art from the following descriptions.

According to an aspect of the present disclosure, a display device comprises: a first electrode, a second electrode facing the first electrode, a first insulating layer disposed on the first electrode and the second electrode and positioned between the first electrode and the second electrode, a light emitting element disposed on the first insulating layer, a first passivation layer covering the light emitting element and exposing both end portions of the light emitting element, an organic insulating layer disposed on the first passivation layer, a first contact electrode electrically connected to the first electrode, disposed on the organic insulating layer and in contact with a first end portion of the light emitting element exposed by the first passivation layer, and a second contact electrode electrically connected to the second electrode, disposed on the organic insulating layer and in contact with a second end portion of the light emitting element exposed by the first passivation layer.

The first contact electrode and the second contact electrode may be disposed to be opposed to and separated from each other, the display device further comprising a second passivation layer covering the first contact electrode and the second contact electrode, the second passivation layer being disposed in a region where the first contact electrode and the second contact electrode are separated from each other.

The organic insulating layer may be disposed to cover both side surfaces of the first passivation layer.

At least a part of each of the first contact electrode and the second contact electrode may be in contact with an upper surface of the organic insulating layer, and wherein each end portion of the first contact electrode and the second contact electrode in a mutually opposing direction is disposed on the upper surface of the organic insulating layer.

The first contact electrode and the second contact electrode may be disposed on substantially the same plane.

Respective surfaces of the first contact electrode and the second contact electrode in contact with a side surface of the organic insulating layer may be aligned with respective surfaces of the first contact electrode and the second contact electrode in contact with the light emitting element.

The respective surfaces of the first contact electrode and the second contact electrode in contact with a side surface of the organic insulating layer may be recessed toward a center of the light emitting element from respective surfaces of the first contact electrode and the second contact electrode in contact with the light emitting element.

A lower surface of the light emitting element may be at least partially opposed to and separated from the first insulating layer, and an organic filler made of the same material as the organic insulating layer is partially filled in the separation space between the lower surface of the light emitting element and the first insulating layer.

The first contact electrode may be in partial contact with the organic filler.

The light emitting element may have a cylindrical shape, and a part of the lower surface of the light emitting element may be in direct contact with the first insulating layer.

The display device may further comprise a third passivation layer disposed to cover an upper surface of the first contact electrode and in contact with a lower surface of the second contact electrode.

The display device may further comprise a fourth passivation layer disposed to cover an upper surface of each of the second contact electrode and the third passivation layer.

A one side portion of the second contact electrode facing the first contact electrode may be disposed on the third passivation layer, and wherein one side portion of the first contact electrode facing the second contact electrode may be disposed below the third passivation layer.

A One side surface of the third passivation layer in contact with the second contact electrode may be aligned with one side surface of the organic insulating layer in contact with the second contact electrode.

A lower surface of the light emitting element may be at least partially opposed to and separated from the first insulating layer, and an organic filler made of the same material as the organic insulating layer may be partially filled in the separation space between the lower surface of the light emitting element and the first insulating layer.

The first contact electrode may be in partial contact with the organic filler.

The first end portion of the light emitting element may include a semiconductor material with n-type conductivity, and the second end portion of the light emitting element may include a semiconductor material with p-type conductivity, and wherein an active material layer may be disposed between the first end portion and the second end portion.

According to another aspect of the present disclosure, a method of manufacturing a display device, the method comprises providing a substrate including a first electrode, a second electrode facing the first electrode, a first insulating layer disposed on the first electrode and the second electrode and positioned between the first electrode and the second electrode, and a light emitting element disposed on the first insulating layer, sequentially forming an inorganic insulating layer and an organic insulating layer on the substrate, and patterning the organic insulating layer and the inorganic insulating layer to form an organic insulating layer and a first passivation layer covering the light emitting element and exposing a first end portion of the light emitting element.

The method of manufacturing the display device may further comprise after forming the organic insulating layer and the first passivation layer, forming a first contact electrode which is electrically connected to the first electrode, disposed on the organic insulating layer and in contact with a first end portion of the light emitting element exposed by the first passivation layer.

The method of manufacturing the display device may further comprise forming a second passivation layer which is disposed to cover the first contact electrode, covers one surface of the organic insulating layer facing the second electrode, and exposes a second end portion opposite to the first end portion of the light emitting element.

The method of manufacturing the display device may further comprise forming a second contact electrode which is electrically connected to the second electrode, disposed on the second passivation layer, and in contact with the second end portion of the light emitting element exposed by the second passivation layer.

The method of manufacturing the display device may further comprise forming a third passivation layer which is disposed to cover the second contact electrode and the second passivation layer.

A lower surface of the light emitting element may be at least partially opposed to and separated from the first insulating layer, and the forming an organic insulating layer may comprise partially filling an organic filler made of the same material as the organic insulating layer in the separation space between the lower surface of the light emitting element and the first insulating layer.

The patterning the inorganic insulating layer may comprise dry etching the inorganic insulating layer.

The forming an organic insulating layer and a first passivation layer may comprise exposing a second end portion opposite to the first end portion of the light emitting element.

The method of manufacturing the display device may further comprise forming a third contact electrode which is electrically connected to the first electrode, disposed on the organic insulating layer and in contact with a first end portion of the light emitting element exposed by the first passivation layer, and a fourth contact electrode which is electrically connected to the second electrode, disposed on the organic insulating layer and in contact with a second end portion of the light emitting element exposed by the first passivation layer.

The third contact electrode and the fourth contact electrode may be patterned in the same process.

A lower surface of the light emitting element may be at least partially opposed to and separated from the first insulating layer, and the forming an organic insulating layer may comprise partially filling an organic filler made of the same material as the organic insulating layer in the separation space between the lower surface of the light emitting element and the first insulating layer.

The patterning the inorganic insulating layer may comprise dry etching the inorganic insulating layer.

The details of other embodiments are included in the detailed description and the drawings.

According to embodiments of the present disclosure, by stacking an organic insulating layer on an insulating layer for fixing a light emitting element, it is possible to fill an organic material in a seam of inorganic crystals of the insulating layer and a gap formed below the light emitting element. Accordingly, in a patterning process performed after aligning light emitting elements, it is possible to prevent the gap formed below the light emitting element from becoming large, and to prevent a problem of disconnection of a contact electrode material and a short-circuit failure.

Advantageous effects according to the present disclosure are not limited to those mentioned above, and various other advantageous effects are included herein.

BRIEF DESCRIPTION OF THE DRAWINGS

FIG. 1 is a plan view of a display device according to an embodiment of the present disclosure.

FIG. 2 is a cross-sectional view taken along line I-I' of FIG. 1.

FIG. 3 is a schematic diagram of a light emitting element according to an embodiment.

FIGS. 4 and 5 are schematic diagrams of light emitting elements according to other embodiments.

FIGS. 6 to 17 show a method of manufacturing a display device according to an embodiment of the present disclosure.

FIGS. 18 and 19 are cross-sectional views schematically showing a state in which a sixth insulating layer or a first contact electrode is formed on a light emitting element of a display device according to a comparative example.

FIGS. 20 and 21 are cross-sectional views schematically showing a state in which a sixth insulating layer or a first contact electrode is formed on a light emitting element of a display device according to an embodiment.

FIGS. 22 and 23 are scanning electron microscope (SEM) photographs showing the cross sections of FIGS. 18 and 21.

FIG. 24 is a cross-sectional view of a display device according to another embodiment.

FIGS. 25 to 29 are sequence diagrams showing partial steps of a method of manufacturing the display device of FIG. 24.

FIG. 30 is a cross-sectional view of a display device according to still another embodiment.

FIGS. 31 to 33 are sequence diagrams showing partial steps of a method of manufacturing the display device of FIG. 30.

FIG. 34 is a cross-sectional view of a display device according to still another embodiment.

FIGS. 35 and 36 are sequence diagrams showing partial steps of a method of manufacturing the display device of FIG. 34.

FIG. 37 is a cross-sectional view of a display device according to still another embodiment.

DETAILED DESCRIPTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present invention. Similarly, the second element could also be termed the first element.

Hereinafter, exemplary embodiments of the present disclosure will be described with reference to the accompanying drawings.

FIG. 1 is a plan view of a display device according to an embodiment of the present disclosure. FIG. 2 is a cross-sectional view taken along line I-I' of FIG. 1.

A display device 10 may include a plurality of pixels PX. The plurality of pixels PX may be disposed in a display unit of the display device 10, and each of the plurality of pixels PX may display light of a specific wavelength band on the outside of the display device 10. Although three pixels PX are illustrated in FIG. 1 by way of example, the display device 10 may include a larger number of pixels.

The plurality of pixels PX may include one or more light emitting elements 350 that emit light of a specific wavelength band. In one embodiment, the pixels PX that display different colors may include the light emitting elements 350 that emit different colors. For example, a first pixel PX1 for displaying red light may include a light emitting element 350 for emitting red light, and a second pixel PX2 for displaying green may include a light emitting element 350 for emitting green light, and a third pixel PX3 for displaying blue may include a light emitting element 350 for emitting blue light. However, the present disclosure is not limited thereto. In some cases, the pixels displaying different colors may include the light emitting elements 350 emitting the same color (e.g., blue), and a wavelength conversion layer or a color filter may be disposed on a light emitting path to generate the desired color of each pixel.

The display device 10 may include a pixel electrode 330 and a common electrode 340. The pixel electrode 330 may be disposed for each pixel PX and the common electrode 340 may be disposed along the plurality of pixels PX. One of the common electrode 340 and the pixel electrode 330 may be an anode electrode and the other one may be a cathode electrode.

In one pixel PX, the pixel electrode 330 and the common electrode 340 include opposing portions spaced apart from each other. The light emitting element 350 may be disposed between the pixel electrode 330 and the common electrode 340 facing each other. One end of the light emitting element 350 may be electrically connected to the pixel electrode 330 and the other end of the light emitting element 350 may be connected to the common electrode 340.

At least a part of the pixel electrode 330 and the common electrode 340 may be utilized to form an electric field in the pixel PX in order to align the light emitting elements 350. In an element, when the light emitting elements 350 that emit different colors to the plurality of pixels PX are aligned, it is necessary to accurately align a different light emitting element 350 for each of the pixels PX. In order to align the light emitting elements 350 using a dielectrophoretic method, a solution containing the light emitting elements 350 is applied to the display device 10, and an AC power is applied thereto to form a capacitance due to an electric field, so that the light emitting elements 350 can be aligned by applying a dielectrophoretic force thereto.

The common electrode 340 may include a stem portion extending in a first direction and at least one branch portion branched from the stem portion. The stem portion of the common electrode 340 may extend to another adjacent pixel in the first direction. The pixel electrode 330 may include a stem portion extending in the first direction and at least one branch portion branched from the stem portion. The stem portion of the pixel electrode 330 may be disposed only in the corresponding pixel PX and the stem portions of the pixel electrodes 330 of adjacent pixels in the first direction may be electrically isolated.

The stem portion of the common electrode 340 and the stem portion of the pixel electrode 330 are spaced apart from each other. The stem portion of the common electrode 340 may be located at one side in the second direction from the center of the pixel and the stem portion of the pixel electrode 330 may be located at the other side in the second direction from the center of the pixel. The branch portion of the common electrode 340 and the branch portion of the pixel electrode 330 may be arranged to face each other in a space between the stem portion of the common electrode 340 and the stem portion of the pixel electrode 330. In an embodiment, the branch portion of the common electrode 340 may extend in the second direction toward the stem portion of the pixel electrode 330, and may terminate in a state where it is separated from the stem portion of the pixel electrode 330 (i.e., the extended end portion of the common electrode 340 is separated from the stem portion of the pixel electrode 330). The branch portion of the pixel electrode 330 may extend in the second direction toward the stem portion of the common electrode 340 and may terminate in a state where it is separated from the stem portion of the common electrode 340.

Each of the branch portion of the common electrode 340 and the branch portion of the pixel electrode 330 may include one or more branch portions. When each of the branch portion of the common electrode 340 and the branch portion of the pixel electrode 330 has a plurality of branch portions, the branch portions may be alternately arranged along the first direction. In an embodiment of a structure in which their branch portions face each other, the same number of branch portions may be provided or the number of branch portions of either one may be one more than the number of branch portions of the other one. Although it is illustrated in the drawing that one stem portion of the common electrode 340 is arranged in one pixel, and two stem portions of the pixel electrode 330 are arranged in one pixel, the present disclosure is not limited thereto. If the branch portion of the pixel electrode 330 includes only one branch portion, the stem portion of the pixel electrode 330 may be omitted.

Although not shown in the drawing, one end of the stem portion of each of the pixel electrode 330 and the common electrode 340 may be connected to a signal applying pad (not shown). An electric signal applied from the signal applying pad may be transmitted to each branch portion and may be transmitted to the light emitting element 350 disposed between the pixel electrode 330 and the common electrode 340.

In addition, a pixel electrode contact hole CNTD and a common electrode contact hole CNTS may be disposed in the stem portion of each of the pixel electrode 330 and the common electrode 340, respectively. The pixel electrode contact hole CNTD and the common electrode contact hole CNTS may be electrically connected to a first thin film transistor 120 and a power supply wiring 161 to be described later, respectively.

In FIG. 1, it is illustrated that the pixel electrode contact hole CNTD and the common electrode contact hole CNTS are disposed in the stem portions of the pixel electrode 330 and the common electrode 340, respectively. However, the present disclosure is not limited thereto. Although not shown in the drawing, the pixel electrode contact hole CNTD and the common electrode contact hole CNTS may be disposed on the branch portions of the pixel electrode 330 and the common electrode 340, respectively. That is, the pixel electrode contact hole CNTD and the common electrode contact hole CNTS may be disposed adjacent to the light emitting element 350 disposed between the branch portions of the pixel electrode 330 and the common electrode 340, and may be disposed within a pixel region where the light emitting elements 350 are disposed. Accordingly, different electric signals may be applied to the pixel electrode 330 and the common electrode 340 of each pixel PX through the pixel electrode contact hole CNTD and the common electrode contact hole CNTS.

Further, as shown in FIG. 1, the pixel electrode contact hole CNTD and the common electrode contact hole CNTS may be provided for each pixel PX. In some embodiments, the common electrode 340 may be electrically connected to the power supply wiring 161 in one common electrode contact hole CNTS as the stem portion of the common electrode 340 extends to the neighboring pixel PX. Unlike the pixel electrode 330, since the common electrode 340 includes one stem portion for each of the plurality of pixels PX, the same electric signal may be applied thereto. In this case, one common electrode contact hole CNTS may be disposed in the common electrode 340. The common electrode contact hole CNTS may be provided in the pixel region in which the light emitting elements 350 are disposed. However, the present disclosure is not limited thereto, and it may be disposed in an outer portion of the panel on which the pixels PX are disposed. In other words, the common electrode 340 may receive the same electric signal through one common electrode contact hole CNTS disposed in the outer portion of the display device 10.

Hereinafter, the cross-sectional structure of the display device will be described in detail.

FIG. 2 is a cross-sectional view of one pixel of a display device according to one embodiment. Referring to FIGS. 1 and 2, the display device 10 may include a substrate 110, thin film transistors 120 and 140 disposed on the substrate 110, the electrodes 330 and 340 disposed on the thin film transistors 120 and 140, and the light emitting elements 350. The thin film transistors may include a first thin film transistor 120 which is a driving transistor and a second thin film transistor 140 which is a switching transistor. Each thin film transistor may include an active layer, a gate electrode, a source electrode and a drain electrode. The pixel electrode 330 may be electrically connected to the drain electrode of the first driving transistor 120.

In an embodiment, the substrate 110 may be an insulating substrate. The substrate 110 may be made of an insulating material such as glass, quartz or polymer resin. Examples of the polymeric material may include polyethersulphone (PES), polyacrylate (PA), polyarylate (PAR), polyetherimide (PEI), polyethylene naphthalate (PEN), polyethylene terepthalate (PET), polyphenylene sulfide (PPS), polyallylate, polyimide (PI), polycarbonate (PC), cellulose triacetate (CAT), cellulose acetate propionate (CAP), or a combination thereof. The substrate 110 may be a rigid substrate, or may be a flexible substrate capable of being bent, folded or rolled.

A buffer layer 115 may be disposed on the substrate 110. The buffer layer 115 can prevent diffusion of impurity ions, prevent penetration of moisture or outside air and perform surface planarization. The buffer layer 115 may include silicon nitride, silicon oxide, silicon oxynitride, or the like.

A semiconductor layer is disposed on the buffer layer 115. The semiconductor layer may include a first active layer 126 of the first thin film transistor 120, a second active layer 146 of the second thin film transistor 140, and an auxiliary layer 163. The semiconductor layer may include polycrystalline silicon, monocrystalline silicon, an oxide semiconductor, or the like.

A first insulating layer 170 is disposed on the semiconductor layer. The first insulating layer 170 covers the semiconductor layer. The first insulating layer 170 may function as a gate insulating film of the thin film transistor. The first insulating layer 170 may include silicon oxide, silicon nitride, silicon oxynitride, aluminum oxide, tantalum oxide, hafnium oxide, zirconium oxide, titanium oxide, and the like, which may be used alone or in combination with each other.

A first conductive layer is disposed on the first insulating layer 170. The first conductive layer may include a first gate electrode 121 disposed on the first active layer 126 of the first thin film transistor 120, a second gate electrode 141 disposed on the second active layer 146 of the second thin film transistor 140, and the power supply wiring 161 disposed on the auxiliary layer 163, with the first insulating layer 170 interposed therebetween. The first conductive layer may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first conductive layer may be a single film or a multilayer film.

A second insulating layer 180 is disposed on the first conductive layer. The second insulating layer 180 may be an interlayer insulating film. The second insulating layer 180 may be formed of an inorganic insulating material such as silicon oxide, silicon nitride, silicon oxynitride, hafnium oxide, aluminum oxide, titanium oxide, tantalum oxide and zinc oxide.

A second conductive layer is disposed on the second insulating layer 180. The second conductive layer includes a capacitor electrode 128 disposed on the first gate electrode 121 with the second insulating layer interposed therebetween. The capacitor electrode 128 and the first gate electrode 121 may form a holding capacitor.

In the same manner as the above-described first conductive layer, the second conductive layer may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

A third insulating layer 190 is disposed on the second conductive layer. The third insulating layer 190 may be an interlayer insulating film. Furthermore, the third insulating layer 190 may perform surface planarization. The third insulating layer 190 may include an organic insulating material such as acrylic resin, epoxy resin, phenolic resin, polyamide resin, polyimide resin, unsaturated polyester resin, polyphenylene resin, polyphenylene sulfide resin, and/or benzocyclobutene (BCB).

A third conductive layer is disposed on the third insulating layer 190. The third conductive layer includes a first drain electrode 123 and a first source electrode 124 of the first thin film transistor 120, a second drain electrode 143 and a second source electrode 144 of the second thin film transistor 140, and a power supply electrode 162 disposed on the power supply wiring 161.

The first source electrode 124 and the first drain electrode 123 may be electrically connected to the first active layer 126 via a first contact hole 129 passing through the third insulating layer 190 and the second insulating layer 180, respectively. The second source electrode 144 and the second drain electrode 143 are electrically connected to the second active layer 146 via a second contact hole 149 passing through the third insulating layer 190 and the second insulating layer 180, respectively. The power supply electrode 162 may be electrically connected to the power supply wiring 161 via a third contact hole 169 passing through the third insulating layer 190 and the second insulating layer 180.

The third conductive layer may include at least one metal selected from the group consisting of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The third conductive layer may be a single film or a multilayer film. For example, the third conductive layer may have a stacked structure of Ti/Al/Ti, Mo/Al/Mo, Mo/AlGe/Mo, Ti/Cu, or the like.

A fourth insulating layer 310 is disposed on the third conductive layer. The fourth insulating layer 310 may include an organic insulating material such as acrylic resin, epoxy resin, phenolic resin, polyamide resin, polyimide resin, unsaturated polyester resin, polyphenylene resin, polyphenylene sulfide resin, and/or benzocyclobutene (BCB). The surface of the fourth insulating layer 310 may be flat.

A partition 410 may be disposed on the fourth insulating layer 310. At least a part of the pixel electrode 330 and at least a part of the common electrode 340 may be disposed on the partition 410. For example, the partition 410 may include at least one first partition 411 on which the branch portion of the pixel electrode 330 is disposed, and at least one second partition 412 on which the branch portion of the common electrode 340 is disposed. Although one first partition 411 and one second partition 412 are illustrated in FIG. 2, partitions corresponding to the number of the branch portions may be disposed in one pixel. For example, in the case of the arrangement structure of FIG. 1, the number of the first partitions 411 disposed in one pixel may be two, and the number of the second partitions 412 disposed in one pixel may be one.

The pixel electrode 330 and the common electrode 340 may be disposed on the first partition 411 and the second partition 412, respectively.

A first reflective layer 331 and a second reflective layer 341 may be disposed on the partition 410.

The first reflective layer 331 covers the first partition 411 and is electrically connected to the first drain electrode 123 of the first thin film transistor 120 via a fourth contact hole 319_1 passing through the fourth insulating layer 310. The second reflective layer 341 is spaced apart from the first reflective layer 331. The second reflective layer 341 covers the second partition 412 and is electrically connected to the power supply electrode 162 via a fifth contact hole 319_2 passing through the fourth insulating layer 310.

In an embodiment, the first reflective layer 331 and the second reflective layer 341 may transmit light toward the outside of the display device 10 by reflecting light emitted from the light emitting elements 350. The light emitted from the light emitting elements 350 is emitted in all directions without directivity. The light directed toward the first reflective layer 331 and the second reflective layer 341 may be reflected to the outside of the display device 10, for example, to the upper portion of the partition 410. Accordingly, light emitted from the light emitting elements 350 can be concentrated in one direction to increase light efficiency. The first reflective layer 331 and the second reflective layer 341 may include a material having high reflectivity to reflect light emitted from the light emitting elements 350. For example, the first reflective layer 331 and the second reflective layer 341 may include a material such as silver (Ag), copper (Cu) and the like, but the present disclosure is not limited thereto.

A first electrode layer 332 and a second electrode layer 342 may be disposed on the first reflective layer 331 and the second reflective layer 341, respectively.

The first electrode layer 332 is disposed directly above the first reflective layer 331. The first electrode layer 332 may have substantially the same pattern as the first reflective layer 331.

The second electrode layer 342 is disposed directly above the second reflective layer 341. The second electrode layer 342 is disposed to be separated from the first electrode layer 332. The second electrode layer 342 may have substantially the same pattern as the second reflective layer 341.

In one embodiment, the first electrode layer 332 and the second electrode layer 342 may cover the first and second reflective layers 331 and 341, respectively, disposed therebelow. In an embodiment, the first electrode layer 332 and the second electrode layer 342 may formed to be larger than the first reflective layer 331 and the second reflective layer 341 to cover the side surfaces of end portions of the first electrode layer 332 and the second electrode layer 342. However, the present disclosure is not limited thereto.

The first electrode layer 332 and the second electrode layer 342 may transmit electrical signals transmitted to the first reflective layer 331 and the second reflective layer 341 to contact electrodes which will be described later. The electrode layers 332 and 342 may include a transparent conductive material. For example, the first electrode layer 332 and the second electrode layer 342 may include a material such as Indium Tin Oxide (ITO), Indium Zinc Oxide (IZO) and/or Indium Tin-Zinc Oxide (ITZO), but the present disclosure is not limited thereto.

The first reflective layer 331 and the first electrode layer 332, which are disposed on the first partition 411, form the pixel electrode 330. The pixel electrode 330 may protrude to a region extending from both ends of the first partition 411. Accordingly, the pixel electrode 330 may contact the fourth insulating layer 310 in the protruding region. Further, the second reflective layer 341 and the second electrode layer 342, which are disposed on the second partition 412, form the common electrode 340. The common electrode 340 may protrude to a region extending from both ends of the second partition 412. Accordingly, the common electrode 340 may contact the fourth insulating layer 310 in the protruding region.

In an embodiment, the pixel electrode 330 and the common electrode 340 may be disposed to cover the entire area of the first partition 411 and the second partition 412, respectively. However, the pixel electrode 330 and the common electrode 340 are spaced apart from each other. In a separation space where the pixel electrode 330 and the common electrode 340 are separated from each other, a fifth insulating layer 510 may be disposed and the light emitting element 350 may be disposed thereon as will be described later.

Since the first reflective layer 331 can receive a driving voltage from the first thin film transistor 120 and the second reflective layer 341 can receive a power supply voltage from the power supply wiring 161, the pixel electrode 330 and the common electrode 340 receive a driving voltage and a power supply voltage, respectively. As will be described later, a first contact electrode 360 and a second contact electrode 370 disposed on the pixel electrode 330 and the common electrode 340, respectively, may transmit the driving voltage and the power supply voltage to the light emitting element 350 and light may be emitted while a predetermined current flows through the light emitting element 350.

A fifth insulating layer 510 is disposed on a portion of the pixel electrode 330 and the common electrode 340. The fifth insulating layer 510 may be disposed in a space between the pixel electrode 330 and the common electrode 340. The fifth insulating layer 510 may be formed in an insular shape or a linear shape along a space between the branch portions of the pixel electrode 330 and the common electrode 340 in plan view.

The light emitting element 350 is disposed on the fifth insulating layer 510. The fifth insulating layer 510 may be disposed between the light emitting element 350 and the fourth insulating layer 310. The lower surface of the fifth insulating layer 510 may be in contact with the fourth insulating layer 310 and the light emitting elements 350 may be disposed on the upper surface of the fifth insulating layer 510. The fifth insulating layer 510 may be in contact with the pixel electrode 330 and the common electrode 340 at both side surfaces to electrically isolate the pixel electrode 330 and the common electrode 340 from each other.

The fifth insulating layer 510 may overlap a portion of the common electrode 340 and the pixel electrode 330, for example, a portion of a region protruding in a direction in which the pixel electrode 330 and the common electrode 340 face each other. For example, end portions of both side surfaces of the fifth insulating layer 510 may cover the upper surface of the region protruding in the direction in which the pixel electrode 330 and the common electrode 340 face each other. The fifth insulating layer 510 can protect a region overlapping the pixel electrode 330 and the common electrode 340 and electrically isolate them from each other. In addition, it is possible to prevent a first semiconductor layer 351 and a second semiconductor layer 352 of the light emitting element 350 from directly contacting other substrates, thereby preventing the light emitting element 350 from being damaged.

FIG. 2 illustrates that the surfaces of the fifth insulating layer 510 in contact with the pixel electrode 330 and the common electrode 340 are aligned with both side surfaces of the light emitting element 350, but the present disclosure is not limited thereto. For example, in an embodiment, the length of the fifth insulating layer 510 may be longer than the length of the light emitting element 350, and the fifth insulating layer 510 may protrude from both side surfaces of the light emitting element 350. Accordingly, the side surfaces of the fifth insulating layer 510 and the light emitting element 350 may be stacked stepwise.

At least one light emitting element 350 may be disposed between the pixel electrode 330 and the common electrode 340. FIG. 1 illustrates an embodiment where the light emitting element 350 that emits light of the same color is disposed for each pixel PX. However, the present disclosure is not limited thereto, and the light emitting elements 350 emitting light of different colors may be disposed together in one pixel PX as described above.

The pixel electrode 330 and the common electrode 340 may be separated from each other by a predetermined distance, and the separation distance may be equal to or smaller than the length of the light emitting element 350. Accordingly, the electrical contact between the pixel electrode 330 and the common electrode 340 and the light emitting element 350 can be achieved smoothly.

In an embodiment, at least a part of the plurality of light emitting elements 350 may be electrically connected to the pixel electrode 330 at one end and may be electrically connected to the common electrode 340 at the other end. The contact electrodes 360 and 370, which will be described later, may be disposed respectively on the common electrode 340 and the pixel electrode 330 connected to the light emitting element 350. The contact electrodes 360 and 370 may be in contact with the light emitting element 350 such that the light emitting element 350 is electrically connected to each of the electrodes 330 and 340. In such an embodiment, the contact electrodes 360 and 370 may contact at least side portions of the light emitting element 350 at both ends. Accordingly, the light emitting element 350 may emit light of a specific color by receiving an electric signal.

In some embodiments, one end of the light emitting element 350 in contact with the pixel electrode 330 may be an n-type doped conductive material layer, and the other end of the light emitting element 350 in contact with the common electrode 340 may be a p-type doped conductive material layer. The other end of the light emitting element 350 in contact with the common electrode 340 may be an electrode material layer. Accordingly, the light emitting element 350 may have a structure in which an n-type conductive material layer, an active material layer and a p-type conductive material layer (or an electrode material layer) are sequentially stacked (in a horizontal direction) from one end in contact with the pixel electrode 330 to the other end in contact with the common electrode 340. However, the present disclosure is not limited thereto.

The light emitting element 350 may be disposed between the pixel electrode 330 and the common electrode 340 which are spaced apart from each other. The light emitting element 350 may emit light of a different color depending on a material of the active material layer. The light emitting elements 350 of different types may be aligned in the respective pixels PX to emit light of different colors. For example, the plurality of pixels PX may emit blue, green and red light, respectively, by emitting light in a blue, green and red wavelength band. However, the present disclosure is not limited thereto. In some cases, the plurality of light emitting elements 350 may emit light of the same color wavelength band so that the plurality of pixels PX can emit light of the same color (e.g., blue). In addition, light emitting elements 350 emitting light of different color wavelength bands may be disposed in one pixel PX to emit light of another color (e.g., white).

The light emitting element 350 may be a light emitting diode. The light emitting element 350 may be a nanostructure whose size is generally in a nanometer scale. The light emitting element 350 may be an inorganic light emitting diode made of an inorganic material. When the light emitting element 350 is an inorganic light emitting diode, if a light emitting material having an inorganic crystal structure is disposed between two opposing electrodes and an electric field is formed in a specific direction in the light emitting material, an inorganic light emitting diode may be aligned between the two electrodes at which a specific polarity is formed. A detailed description thereof will be given later.

The sixth insulating layer 520 may be disposed on the light emitting element 350 to protect the light emitting element 350 and fix the light emitting element 350 between the pixel electrode 330 and the common electrode 340. Although not shown in FIG. 2, the sixth insulating layer 520 may be disposed on the outer surface of the light emitting element 350 to fix the light emitting element 350. The sixth insulating layer 520 may be disposed on a portion of the outer surface of the light emitting element 350 to expose both side surfaces of the light emitting element 350. In an embodiment, the length of the sixth insulating layer 520 is shorter than that of the light emitting element 350, so that the sixth insulating layer 520 can be recessed inwardly from both side surfaces of the light emitting device 350. Accordingly, the side surfaces of the fifth insulating layer 510, the light emitting element 350 and the sixth insulating layer 520 may be stacked in a stepwise manner. In this embodiment,
the first contact electrode 360 and the second contact electrode 370 can be smoothly brought into contact with the side surface of the light emitting element 350 by disposing the sixth insulating layer 520 similarly to the fifth insulating layer 510.

However, the present disclosure is not limited thereto, and the length of the sixth insulating layer 520 may be equal to the length of the light emitting element 350 such that both side portions of the sixth insulating layer 520 to the light emitting element 350 can be aligned. In addition, when the sixth insulating layer 520 is patterned simultaneously with the fifth insulating layer 510, the sixth insulating layer 520 may be aligned with the light emitting element 350 and the fifth insulating layer 510 at both side portions.

In an embodiment, the sixth insulating layer 520 may include an insulating inorganic material, as will be described later. Accordingly, the sixth insulating layer 520 formed through a mask process may have a defect (e.g., a seam) of inorganic crystals formed on the upper surface, the outer peripheral surface of the light emitting element 350, and a region adjacent to the light emitting element 350. When the seam is formed in the region where the light emitting element 350 and the inorganic layer are in contact with each other, in a subsequent mask process, the inorganic layer may be excessively etched in the seam or, in some cases, the contact materials may be separated. In addition, a gap G may be formed between the light emitting element 350 and the fourth insulating layer 310.

In addition, when the inorganic layer is deposited, the sixth insulating layer 520 may be formed non-uniformly on the light emitting element 350 because the step-coverage is poor. Even when the first contact electrode 360 and the second contact electrode 370 are formed, the contact electrode material may be broken and the light emitting element 350 may be electrically disconnected when the step-coverage is poor.

Accordingly, in the display device 10 according to an embodiment, a seventh insulating layer 530 is disposed on the sixth insulating layer 520. Although it is illustrated in FIG. 2 that the end surface of the seventh insulating layer 530 is disposed on the end surface of the sixth insulating layer 520, the seventh insulating layer 530 may be formed to cover the outer surface of the sixth insulating layer 520. However, the seventh insulating layer 530 may be disposed to be recessed from one side surface of the sixth insulating layer 520 so as to expose at least a part of the upper surface of the sixth insulating layer 520. Accordingly, the first contact electrode 360 and the second contact electrode 370 can be in contact with the light emitting element 350.

The seventh insulating layer 530 may fill a seam formed in an inorganic layer such as the sixth insulating layer 520 or a gap formed below the light emitting element 350. As a result, it is possible to eliminate the poor step-coverage of the sixth insulating layer 520 and to prevent a problem of disconnection of the contact electrode material. In addition, the sixth insulating layer 520 may be planarized by the seventh insulating layer 530. When the upper surface of the sixth insulating layer 520 is planarized by the seventh insulating layer 530, a process of forming the first contact electrode 360 and the second contact electrode 370 may be performed relatively smoothly. A detailed description thereof will be given later.

The seventh insulating layer 530 may be disposed on the upper surface of the sixth insulating layer 520 and at least a part of the seventh insulating layer 530 may be disposed to cover one side surface of the sixth insulating layer 520 in cross section. That is, one side surface of the sixth insulating layer 520 is protected by being in contact with the seventh insulating layer 530, and the other side surface of the sixth insulating layer 520 may be exposed to be in contact with other members such as the second contact electrode 370.

Further, at least a part of the seventh insulating layer 530 disposed to cover the sixth insulating layer 520 may be filled in a space that can be formed on the lower surface of the light emitting device 350. The seventh insulating layer 530 may be depressed centrally in the longitudinal direction with respect to both sides. In an embodiment, the length of the seventh insulating layer 530 is shorter than that of the light emitting element 350, so that the light emitting element 350 and the seventh insulating layer 530 can be stacked in a stepwise manner.

However, the structure of the seventh insulating layer 530 and the sixth insulating layer 520 is not limited to the structure shown in FIG. 2. According to some embodiments, both side surfaces of the seventh insulating layer 530 and the sixth insulating layer 520 may be in parallel with each other and have the same shape. A more detailed description thereof will be given later with reference to other embodiments.

The seventh insulating layer 530 may include thereon the first contact electrode 360, which is disposed on the pixel electrode 330 and overlaps at least a part of the seventh insulating layer 530, and the second contact electrode 370, which is disposed on the common electrode 340, separated from the first contact electrode 360 and in contact with at least a part of the seventh insulating layer 530.

The first contact electrode 360 and the second contact electrode 370 may be disposed on the upper surfaces of the pixel electrode 330 and the common electrode 340, respectively. In an embodiment, the first contact electrode 360 and the second contact electrode 370 may be in contact with the first electrode layer 332 and the second electrode layer 342 on the upper surfaces of the pixel electrode 330 and the common electrode 340, respectively. The first contact electrode 360 and the second contact electrode 370 may be in contact with the first semiconductor layer 351 and the second semiconductor layer 352 of the light emitting element 350, respectively. Accordingly, the first contact electrode 360 and the second contact electrode 370 may transmit an electric signal applied to the first electrode layer 332 and the second electrode layer 342 to the light emitting element 350.

The first contact electrode 360 may be disposed on the pixel electrode 330 to cover the pixel electrode 330 and the lower surface of the first contact electrode 360 may partially contact the light emitting element 350 and the seventh insulating layer 530. One end of the first contact electrode 360, in the direction in which the common electrode 340 is disposed, is disposed on the seventh insulating layer 530. The second contact electrode 370 may be disposed on the common electrode 340 to cover the common electrode 340 and the lower surface of the second contact electrode 370 may be in partial contact with the light emitting element 350, the seventh insulating layer 530, and an eighth insulating layer 540. One end of the second contact electrode 370, in the direction in which the pixel electrode 330 is disposed, is disposed on the eighth insulating layer 540.

The first contact electrode 360 and the second contact electrode 370 may be disposed to be separated from each other on the seventh insulating layer 530 or the eighth insulating layer 540. That is, the first contact electrode 360 and the second contact electrode 370 may be in contact with the light emitting element 350 and the seventh insulating layer 530 or the eighth insulating layer 540, but may not be connected to each other because they are separated from each other on the seventh insulating layer 530. Accordingly, the first contact electrode 360 and the second contact electrode 370 may receive different power supplies from the first thin film transistor 120 and the power supply wiring 161. For example, the first contact electrode 360 may receive a driving voltage applied to the pixel electrode 330 from the first thin film transistor 120, and the second contact electrode 370 may receive a power supply voltage applied to the common electrode 340 from the power supply wiring 161. However, the present disclosure is not limited thereto.

The first contact electrode 360 and the second contact electrode 370 may include a conductive material. For example, the conductive material may include ITO, IZO, ITZO, aluminum (Al), or the like. However, the present disclosure is not limited thereto.

Further, the first contact electrode 360 and the second contact electrode 370 may include the same material as the first electrode layer 332 and the second electrode layer 342. The first contact electrode 360 and the second contact electrode 370 may be disposed in substantially the same pattern on the first electrode layer 332 and the second electrode layer 342 so as to be contactable with the first electrode layer 332 and the second electrode layer 342. The first contact electrode 360 and the second contact electrode 370 which are in contact with the first electrode layer 332 and the second electrode layer 342 may receive an electric signal applied to the first electrode layer 332 and the second electrode layer 342 and may transmit the electric signal to the light emitting element 350

The eighth insulating layer 540 may be disposed to cover the first contact electrode 360 and may be disposed so as not to overlap a partial region of the light emitting element 350 to allow the light emitting element 350 to be connected to the second contact electrode 370. The eighth insulating layer 540 may partially contact the first contact electrode 360 and the seventh insulating layer 530 on the upper surface of the seventh insulating layer 530. The eighth insulating layer 540 may be disposed to cover one end portion of the first contact electrode 360 on the upper surface of the seventh insulating layer 530. Accordingly, the eighth insulating layer 540 can electrically isolate the first contact electrode 360 from the second contact electrode 370 while protecting the first contact electrode 360.

One end portion of the eighth insulating layer 540 in the direction in which the common electrode 340 is disposed may be disposed to cover the seventh insulating layer 530 and may be aligned with one side surface of the sixth insulating layer 520.

In some embodiments to be described later, the eighth insulating layer 540 may be omitted from the display device 10. Accordingly, the first contact electrode 360 and the second contact electrode 370 may be disposed on substantially the same plane, and the first contact electrode 360 and the second contact electrode 370 may be electrically isolated from each other by a passivation layer 550 to be described later. A detailed description thereof will be given with reference to other embodiments.

The passivation layer 550 may be formed on the eighth insulating layer 540 and the second contact electrode 370 so as to protect the members disposed on the fourth insulating layer 310 from the external environment. When the first contact electrode 360 and the second contact electrode 370 are exposed, damage to the electrodes may cause a problem of disconnection of the contact electrode material, and therefore the electrodes 360, 370 may be covered with the passivation layer 550. That is, the passivation layer 550 may be disposed to cover the pixel electrode 330, the common electrode 340, the light emitting element 350, and the like. In addition, as described above, when the eighth insulating layer 540 is omitted, the passivation layer 550 may be formed on the first contact electrode 360 and the second contact electrode 370. In this embodiment, the passivation layer 550 may electrically isolate the first contact electrode 360 and the second contact electrode 370 from each other.

Each of the fifth insulating layer 510, the sixth insulating layer 520, the eighth insulating layer 540 and the passivation layer 550 may include an inorganic insulating material. For example, the fifth insulating layer 510, the sixth insulating layer 520, the eighth insulating layer 540 and the passivation layer 550 may include a material such as silicon oxide ($SiO_x$), silicon nitride ($SiN_x$), silicon oxynitride ($SiO_xN_y$), aluminum oxide ($Al_2O_3$) and/or aluminum nitride (AlN). The fifth insulating layer 510, the sixth insulating layer 520, the eighth insulating layer 540, and the passivation layer 550 may be formed of the same material or different materials. In addition, various materials are applicable to impart insulation properties to the fifth insulating layer 510, the sixth insulating layer 520, the eighth insulating layer 540 and the passivation layer 550.

In an embodiment, the fifth insulating layer 510, the eighth insulating layer 540 and the passivation layer 550 may further include an organic insulating material as in the seventh insulating layer 530. However, the present disclosure is not limited thereto. The organic insulating material included in the seventh insulating layer 530 is not particularly limited as long as it falls within a range that does not affect the characteristics of the light emitting element solution S shown in FIG. 10. For example, the organic insulating material may include at least one selected from the group consisting of epoxy resin, cardo resin, polyimide resin, acrylic resin, siloxane resin and silsesquioxane resin, but the present disclosure is not limited thereto.

As described above, the display device 10 according to one embodiment may include the pixel electrode 330, the common electrode 340 and the light emitting element 350 disposed between the pixel electrode 330 and the common electrode 340. The light emitting element 350 may emit light of a specific wavelength band by receiving an electric signal from the first contact electrode 360 and the second contact electrode 370. However, in a process of patterning the first contact electrode 360 and the second contact electrode 370, a defect (e.g., a seam) may occur in inorganic crystals around the light emitting element 350 and a gap may be formed below the light emitting element 350. Thus, by filling the seam or gap with an organic insulating material, including the seventh insulating layer 530, it is possible to prevent disconnection of the contact material between the light emitting element 350 and the first contact electrode 360 and the second contact electrode 370 or a short-circuit failure due to the gap.

In an embodiment, the light emitting element 350 may be manufactured by an epitaxial growth method on a substrate. The growth may be performed by forming a seed crystal layer for forming a semiconductor layer on a substrate, and depositing a desired semiconductor material. Hereinafter, the structure of the light emitting element 350 according to various embodiments will be described in detail with reference to FIGS. 3 to 5.

FIG. 3 is a schematic diagram of a light emitting element according to an embodiment. FIGS. 4 and 5 are schematic diagrams of light emitting elements according to other embodiments.

Referring to FIG. 3, the light emitting element 350 may include a plurality of semiconductor layers 351 and 352 and an active material layer 353 disposed between the plurality of semiconductor layers 351 and 352. The electric signal applied from the pixel electrode 330 and the common electrode 340 may be transmitted to the active material layer 353 through the plurality of semiconductor layers 351 and 352 to emit light.

In an embodiment, the light emitting element 350 may include the first semiconductor layer 351, the second semiconductor layer 352, the active material layer 353 and an insulating material layer 358 disposed between the first semiconductor layer 351 and the second semiconductor layer 352. The light emitting element 350 illustrated in FIG. 4 has a structure in which the first semiconductor layer 351, the active material layer 353, and the second semiconductor layer 352 are sequentially stacked in the longitudinal direction.

The first semiconductor layer 351 may be an n-type semiconductor layer. For example, when the light emitting element 350 emits light of a blue wavelength band, the first semiconductor layer 351 may be a semiconductor material having a chemical formula of $In_xAl_yGa_{1-x-y}N$ ($0 \leq x \leq 1$, $0 \leq y \leq 1$, $0 \leq x+y \leq 1$). For example, it may be at least one of n-type doped InAlGaN, GaN, AlGaN, InGaN, AlN and InN. The first semiconductor layer 351 may be doped with a first conductive dopant. For example, the first conductive dopant may be Si, Ge, Sn, or the like. The length of the first semiconductor layer 351 may range from 1.5 μm to 5 μm, but is not limited thereto.

The second semiconductor layer 352 may be a p-type semiconductor layer. For example, when the light emitting element 350 emits light of a blue wavelength band, the second semiconductor layer 352 may be a semiconductor material having a chemical formula of $In_xAl_yGa_{1-x-y}N$ ($0 \leq x \leq 1$, $0 \leq y \leq 1$, $0 \leq x+y \leq 1$). For example, it may be at least one of p-type doped InAlGaN, GaN, AlGaN, InGaN, AlN and InN. The second semiconductor layer 352 may be doped with a second conductive dopant. For example, the second conductive dopant may be Mg, Zn, Ca, Se, Ba, or the like. The length of the second semiconductor layer 352 may range from 0.08 μm to 0.25 μm, but is not limited thereto.

The active material layer 353 may be disposed between the first semiconductor layer 351 and the second semiconductor layer 352 and may include a material having a single or multiple quantum well structure. However, the present disclosure is not limited thereto, and the active material layer 353 may have a structure in which a semiconductor material having a large band gap energy and a semiconductor material having a small band gap energy are alternately stacked.

The active material layer 353 may emit light by coupling of electron-hole pairs according to an electrical signal applied through the first semiconductor layer 351 and the second semiconductor layer 352. For example, when the active material layer 353 emits light of a blue wavelength band, it may include a material such as AlGaN, AlInGaN or the like, and may include Group III to Group 5 semiconductor materials depending on the wavelength band of the emitted light. Accordingly, the light emitted by the active material layer 353 is not limited to light of a blue wavelength band, but may emit light of a red or green wavelength range as desired. The length of the active material layer 353 may be in a range of 0.05 μm to 0.25 μM, but is not limited thereto.

The light emitted from the active material layer 353 may be emitted not only toward the outer surface of the light emitting element 350 in the longitudinal direction, but also to both side surfaces of the light emitting element 350. That is, the directionality of the light emitted from the active material layer 353 is not limited to a particular direction.

The insulating material layer 358 may be formed outside the light emitting element 350 to protect the light emitting element 350. For example, the insulating material layer 358 may be formed to surround the side surface of the light emitting element 350 and may not be formed at both end portions of the light emitting element 350 in the longitudinal direction, for example, both end portions where the first semiconductor layer 351 and the second semiconductor layer 352 are disposed. However, the present disclosure is not limited thereto. The insulating material layer 358 may include materials having insulation properties such as silicon oxide ($SiO_x$), silicon nitride ($SiN_x$), silicon oxynitride ($SiO_xN_y$), aluminum nitride (AlN), aluminum oxide ($Al_2O_3$) and the like. Accordingly, it is possible to prevent an electrical short that may occur when the active material layer 353 directly contacts the pixel electrode 330 or the common electrode 340. In addition, since the insulating material layer 358 includes the active material layer 353 to protect the outer surface of the light emitting element 350, it is possible to prevent a decrease in luminous efficiency.

The thickness of the insulating material layer 358 may range from 0.5 μm to 1.5 μm, but is not limited thereto.

The light emitting element 350 may be cylindrical. However, the shape of the light emitting element 350 is not limited thereto, and may have various shapes such as a cube, a rectangular parallelepiped or a hexagonal column. The light emitting element 350 may have a length l in the range of 1 μm to 10 μm or 2 μm to 5 μm, preferably, a length of about 4 μm. In addition, the diameter of the light emitting element 350 may range from 400 nm to 700 nm, preferably about 500 nm.

In an embodiment, referring to FIGS. 4 and 5, the light emitting elements 350' and 350" may further include electrode material layers 356 and 357 on at least one of the side surfaces where the first semiconductor layer 351 and the second semiconductor layer 352 are disposed.

In the light emitting element 350' illustrated in FIG. 4, the second semiconductor layer 352 further includes the electrode material layer 357. Further, in the light emitting element 350" illustrated in FIG. 5, the first semiconductor layer 351 and the second semiconductor layer 352 further include the electrode material layers 356 and 357, respectively. For simplicity of description, the electrode layer formed on one side surface where the first semiconductor layer 351 is disposed is referred to as a first electrode material layer 356, and the electrode layer formed on the other side surface where the second semiconductor layer 352 is disposed is referred to as a second electrode material layer 357. However, the present disclosure is not limited thereto, and any electrode layer may be referred to as a first electrode layer.

The light emitting elements 350' and 350" according to other embodiments may include at least one of the first electrode material layer 356 and the second electrode material layer 357. In this embodiment, the insulating material layer 358 may extend in the longitudinal direction to cover the first electrode material layer 356 and the second electrode material layer 357. However, without being limited thereto, the insulating material layer 358 may cover only the first semiconductor layer 351, the active material layer 353 and the second semiconductor layer 352 or only a part of the outer surfaces of the electrode material layers 356 and 357 to expose only a part of the outer surfaces of the first electrode material layer 356 and the second electrode material layer 357.

The first electrode material layer 356 and the second electrode material layer 357 may be ohmic contact electrodes. However, the present disclosure is not limited thereto and the first electrode material layer 356 and the second electrode material layer 357 may be Schottky contact electrodes. The first electrode material layer 356 and the second electrode material layer 357 may include conductive metal. For example, the first electrode material layer 356 and the second electrode material layer 357 may include at least one of aluminum (Al), titanium (Ti), indium (In), gold (Au) and silver (Ag). The first electrode material layer 356 and the second electrode material layer 357 may include the same material and may include different materials. However, the present disclosure is not limited thereto.

Hereinafter, a method of manufacturing the display device 10 according to an embodiment will be described with reference to FIGS. 6 to 17. FIGS. 6 to 17 show a method of manufacturing the display device 10 of FIG. 2.

In addition, the members disposed on the fourth insulating layer 310, for example, the partition 410, the pixel electrode 330, the common electrode 340, the first contact electrode 360, the second contact electrode 370, and a plurality of insulating layers may be patterned by a mask process, which may be typically employed. Therefore, a detailed description of the mask process in which the respective members are formed will be omitted in the following description.

FIGS. 6 to 17 are cross-sectional views showing a schematic sequence of a method of manufacturing a display device according to an embodiment.

First, referring to FIG. 6, a first substrate layer 600 is prepared, which includes the fourth insulating layer 310, the first partition 411 and the second partition 412 separated from each other on the fourth insulating layer 310, the first reflective layer 331 and the second reflective layer 341 respectively disposed on the first partition 411 and the second partition 412, and the first electrode layer 332 and the second electrode layer 342 respectively disposed on the first reflective layer 331 and the second reflective layer 341. The first thin film transistor 120, the second thin film transistor 140 and the power supply wiring 161 may be formed below the fourth insulating layer 310 of the first substrate layer 600 as described above. However, the members are not shown in the following drawings. The structure, arrangement and the like of the members disposed on the fourth insulating layer 310 are the same as those described with reference to FIG. 2. A detailed description thereof will be omitted.

Then, referring to FIG. 7, a fifth insulating material layer 511 is formed to cover both the pixel electrode 330 and the common electrode 340. The fifth insulating material layer 511 may be patterned as described below to form the fifth insulating layer 510 of FIG. 7.

Then, referring to FIG. 8, the light emitting element 350 is aligned between the pixel electrode 330 and the common electrode 340 on the fifth insulating material layer 511. A dielectrophoresis (DEP) method may be used to align the light emitting element 350 between the pixel electrode 330 and the common electrode 340. A detailed description thereof will be given with reference to FIGS. 9 to 11.

First, referring to FIG. 9, the light emitting element solution S including the plurality of light emitting elements 350 may be loaded on the display device 10 such that the light emitting element 350 is transferred onto the pixel electrode 330 and the common electrode 340. The light emitting element solution S may have a form such as ink or paste, and may be at least one of acetone, water, alcohol and toluene. However, the present disclosure is not limited thereto and the light emitting element solution S is not particularly limited as long as it is a material which can be vaporized at room temperature or by heat.

In an embodiment, the light emitting element solution S is brought into contact with a pixel partition 420 and can maintain a hemispherical shape due to the surface tension force of the light emitting element solution S. Although not shown in FIGS. 1 and 2, the pixel partition 420 may perform a function of making the pixels PX distinguished from each other. The region where the light emitting element solution S is in contact with the pixel partition 420 may be subjected to a force exerted toward the center of the light emitting element solution S, and the light emitting element solution S may not flow over the pixel partition 420. Accordingly, when the light emitting element 350 is transferred, it is possible to prevent the light emitting element 350 from moving to another adjacent pixel PX.

When the light emitting element 350 is transferred, an AC power is applied to align the light emitting element 350 using the DEP method.

In an embodiment, referring to FIG. 10, a power supply V is applied to the pixel electrode 330 and the common electrode 340 to form an electric field E between the pixel electrode 330 and the common electrode 340. The power supply V may be an external power supply or an internal power supply of the display device 10. The power supply V may be an AC power supply or a DC power supply having a predetermined amplitude and period. The DC power supply may be repeatedly applied to the pixel electrode 330 and the common electrode 340 to realize a power supply having a predetermined amplitude and period.

When the power supply is applied to the pixel electrode 330 and the common electrode 340, a potential difference is generated by the electric polarity applied to the pixel electrode 330 and the common electrode 340, and an electric field E is formed. The bipolarity is induced in the light emitting element 350 under a nonuniform electric field E, and the light emitting element 350 is driven by a dielectrophoretic force (DEP force) in a direction in which the slope of the electric field E is larger or smaller. The light emitting element 350 may be self-aligned between the pixel electrode 330 and the common electrode 340 by the DEP force.

After the light emitting element 350 is aligned, the light emitting element solution S may be vaporized and removed at room temperature or by heat such that the light emitting element 350 is disposed between the pixel electrode 330 and the common electrode 340 as shown in FIG. 11.

In an embodiment, the light emitting element solution S may include at least one type of the light emitting elements 350. The light emitting element solution S may include the light emitting elements 350 that emit light of various colors in order to align the light emitting elements 350 of different colors for each pixel PX of the display device 10. Further, the light emitting elements 350 that emit light of different colors may be mixed in the light emitting element solution S. However, the present disclosure is not limited thereto.

Then, referring to FIG. 12, a sixth insulating material layer 521 is formed to cover the fifth insulating material layer 511 and the upper portion of the light emitting element 350 to form a second substrate layer 700. The sixth insulating material layer 521 may be patterned by a mask process, similarly to the fifth insulating material layer 511, to finally form the sixth insulating layer 520.

Then, referring to FIGS. 13 and 14, the fifth insulating material layer 511 and the sixth insulating material layer 521 are partially patterned such that the pixel electrode 330 is exposed to the outside, and the seventh insulating layer 530 is patterned on the partially patterned sixth insulating material layer 521. The seventh insulating layer 530 may be patterned to cover a portion of the upper surface of the sixth insulating material layer 521 and one side portion exposed in the direction in which the pixel electrode 330 of the sixth insulating material layer 521 is disposed.

The seventh insulating layer 530 formed on the sixth insulating material layer 521 may fill a gap formed below the light emitting element 350. The seventh insulating layer 530 may include an organic filler made of the same material as the seventh insulating layer 530 and may fill or partially fill a separation space between the lower surface of the light emitting element 350 and the fifth insulating layer 510. An organic material can be diffused more smoothly than an inorganic material. Accordingly, when the seventh insulating layer 530 is formed, the organic material may be diffused and filled in the gap formed below the light emitting element 350 and the seam of the crystals of the sixth insulating material layer 521. In addition, the sixth insulating material layer 521 can be partially planarized by the seventh insulating layer 530. When the sixth insulating material layer 521 is planarized, the members, for example, the first contact electrode 360 and the second contact electrode 370, which are formed in the subsequent patterning process, can be smoothly stacked.

Then, a patterning process for exposing the upper portion of the pixel electrode 330 may be performed by dry etching the sixth insulating layer 520 and the seventh insulating layer 530.

Then, referring to FIG. 15, the first contact electrode 360 is patterned on the pixel electrode 330. The first contact electrode 360 may be formed to cover the pixel electrode 330, and a portion of the first contact electrode 360 may contact the light emitting element 350 and the seventh insulating layer 530.

Then, referring to FIG. 16, the eighth insulating layer 540 is patterned to cover the first contact electrode 360 and expose the common electrode 340. The eighth insulating layer 540 may cover one end portion of the first contact electrode 360 in the direction in which the common electrode 340 is disposed and cover one side surface of the seventh insulating layer 530 in the direction in which the common electrode 340 is disposed.

Then, referring to FIG. 17, the second contact electrode 370 is patterned on the upper surface of the common electrode 340. The second contact electrode 370 may be in partial contact with the common electrode 340, the light emitting element 350, the sixth insulating layer 520, the seventh insulating layer 530 and the eighth insulating layer 540. The second contact electrode 370 may be formed up to a part of the upper portion of the eighth insulating layer 540. Accordingly, the second contact electrode 370 can be electrically isolated from the first contact electrode 360 by the eighth insulating layer 540.

Finally, the passivation layer 550 is formed to cover the eighth insulating layer 540 and the second contact electrode 370. Through the above-described series of processes, the display device 10 according to one embodiment can be manufactured.

In an embodiment, the organic material of the seventh insulating layer 530 can fill the gap formed below the light emitting element 350 or the seam of the inorganic crystals. If only the sixth insulating layer 520 for fixing the light emitting element 350 is formed, the gap or seam may be damaged by a subsequent patterning process and a disconnection problem of the material may occur when the light emitting elements 350 is in contact with the contact electrodes 360 and 370. Hereinafter, a form in which the organic material is filled in the seventh insulating layer 530 will be described in detail with reference to FIGS. 18 to 21.

FIGS. 18 and 19 are cross-sectional views schematically showing a state in which a sixth insulating layer or a first contact electrode is formed on a light emitting element of a display device according to a comparative example.

First, referring to FIG. 18, when the light emitting element 350 is disposed on a fifth insulating layer 510' and a sixth insulating layer 520' is disposed to cover the outer surface of the light emitting element 350, a gap G may be formed under the light emitting element 350. Further, since the sixth insulating layer 520' containing an inorganic material has poor step-coverage, a void may be partially formed in a separation space between the lower surface of the light emitting element 350 and the fifth insulating layer 510'. When the gap G or the seam of inorganic crystals is formed in the fifth insulating layer 510' and the sixth insulating layer 520' disposed around the light emitting element 350 as shown in FIG. 18, the light emitting element 350 may be damaged in the subsequent patterning process.

Referring to FIG. 19, in a part of the light emitting element 350, if the sixth insulating layer 520 is patterned and removed and a first contact electrode 360' is patterned thereon, a disconnection of the material of the first contact electrode 360' may occur. Accordingly, a defect of the pixel including the light emitting element 350 may occur, and a short-circuit failure due to the gap G may occur.

On the other hand, when the seventh insulating layer 530 is further included, the step-coverage of the first contact electrode 360 can be improved by filling the seam of crystals or the gap G that may occur in an inorganic layer around the light emitting element 350.

When the light emitting element 350 has a cylindrical shape, a part of the lower surface of the light emitting element 350 may be in direct contact with the fifth insulating layer 510. In the display device 10 according to one embodiment, the lower surface of the light emitting element 350 may be at least partially opposed to and separated from the fifth insulating layer 510, and an organic filler made of the same material as the organic insulating layer may be partially filled in the separation space between the lower surface of the light emitting element 350 and the fifth insulating layer 510. A detailed description thereof will be given with reference to FIGS. 20 and 21.

FIGS. 20 and 21 are cross-sectional views schematically showing a state in which a sixth insulating layer or a first contact electrode is formed on a light emitting element of a display device according to an embodiment.

First, referring to FIG. 20, the same organic filler as that of the seventh insulating layer 530 may be partially disposed on the lower surface of the light emitting element 350, in a partial region separated from the fifth insulating layer 510. In addition, the organic material may be filled in the gap G that may be formed under the light emitting element 350. Further, referring to FIG. 21, it can be seen that the step-coverage of the first contact electrode 360 can be improved by filling the organic material in a partial region separated from the fifth insulating layer 510 on the lower surface of the light emitting element 350. That is, the first contact electrode 360 may be in partial contact with the organic filler. Accordingly, it is possible to prevent a problem of disconnection of the contact material of the light emitting element 350 or a short-circuit failure of the light emitting element 350 during the manufacture of the display device 10.

FIGS. 22 and 23 are scanning electron microscope (SEM) photographs showing the cross sections of FIGS. 18 and 21 respectively.

Referring to FIG. 22, it can be seen that a gap is formed between the fifth insulating layer 510 and the light emitting element 350 when only the sixth insulating layer 520 is formed. Accordingly, the light emitting element 350 may be damaged or the material of the contact electrode may be broken in an additional mask process. In addition, since the sixth insulating layer 520 is formed along the outer peripheral surface of the light emitting element 350, the upper surface of the sixth insulating layer 520 may not be flat. For example, as shown in FIG. 18, when the cross section of the light emitting element 350 is circular, the sixth insulating layer 520 may also have a circular curvature in cross section. Accordingly, the first contact electrode 360 or the second contact electrode 370, which may be disposed on the sixth insulating layer 520, is non-uniformly disposed, and a failure may occur in contact with the light emitting element 350.

On the other hand, when the seventh insulating layer 530 is disposed on the sixth insulating layer 520, a gap formed below the light emitting element 350 can be filled by diffusion of the organic material in the seventh insulating layer 530, and it is possible to improve the seam of an inorganic crystal interface or poor step-coverage. In addition, since the seventh insulating layer 530 can planarize the upper surface of the sixth insulating layer 520, an additional mask process can be smoothly performed.

Referring to FIG. 23, it can be seen that the seventh insulating layer 530 fills the gap between the light emitting element 350 and the fifth insulating layer 510, unlike the case of FIG. 22. In addition, it can be seen that the upper surface is planarized by the seventh insulating layer 530 disposed on the sixth insulating layer 520. Accordingly, a process of forming the first contact electrode 360 and the second contact electrode 370 to be performed later can be performed smoothly, so that the contact with the light emitting element 350 can be performed smoothly.

As described above, the seventh insulating layer 530 and the sixth insulating layer 520 may have various structures depending on a patterning method of the sixth insulating material layer 521 and a seventh insulating material layer 531. Accordingly, the structures of the members such as the first contact electrode 360, the second contact electrode 370 and the eighth insulating layer 540, which may be disposed on the seventh insulating layer 530, may be varied as well. In some embodiments, when the respective regions of the fifth insulating material layer 511 and the sixth insulating material layer 521 in contact with the pixel electrode 330 and the common electrode 340 are patterned simultaneously, the sixth insulating layer 520 may have a symmetrical structure with respect to the center of the light emitting element 350. Further, when the seventh insulating material layer 531 is patterned simultaneously with the sixth insulating material layer 521, the sixth insulating layer 520 and the seventh insulating layer 530 may have the same structure. That is, the cross-sectional structure of the display device 10 may vary depending on a method of performing an etching process after forming a specific layer. Hereinafter, a display device and a method of manufacturing the same according to other embodiments will be described.

FIG. 24 is a cross-sectional view of a display device according to another embodiment. A display device 10_1 of FIG. 24 is the same as the display device 10 of FIG. 2 except that the structures of a seventh insulating layer 530_1, a sixth insulating layer 520_1 and an eighth insulating layer 540_1 are different. Hereinafter, only differences will be described in detail.

In the display device 10_1 of FIG. 24, one side surface of the seventh insulating layer 530_1 may be aligned with one side surface of the sixth insulating layer 520_1, and the other side surface of the seventh insulating layer 530_1 may be aligned with the other side surface of the sixth insulating layer 520_1 and one side surface of the eighth insulating layer 540_1.

Referring to FIG. 24, both side surfaces of the seventh insulating layer 530_1 and the sixth insulating layer 520_1 may be recessed inwardly relative to both side surfaces of the light emitting element 350, and both side surfaces of the seventh insulating layer 530_1 and the sixth insulating layer 520_1 may be aligned with each other.

When performing a process of exposing the pixel electrode 330, the seventh insulating layer 530_1 and the sixth insulating layer 520_1 may be patterned simultaneously in one mask process so that their first side surfaces in the direction in which the pixel electrode 330 is disposed can be aligned with each other. Further, in a process of exposing the common electrode 340, the eighth insulating layer 5401 may be patterned together with the seventh insulating layer 530_1 and the sixth insulating layer 520_1 so that the second side surfaces opposite to the first side surfaces can be aligned with each other. Accordingly, each of a first contact electrode 360_1 disposed on the pixel electrode 330 and a second contact electrode 370_1 disposed on the common electrode 340 may be in partial contact with the sixth insulating layer 5201. Unlike the display device 10 of FIG. 2, the first contact electrode 360_1 of the display device 10_1 of FIG. 24 may be in parallel contact with one side surface of the sixth insulating layer 520_1 which fixes the light emitting element 350 and one side surface of the seventh insulating layer 530_1 which can fill an empty region that may be formed under the light emitting element 350.

Further, the first contact electrode 360_1 and the second contact electrode 370_1 may be separated from each other on the seventh insulating layer 530_1 and the eighth insulating layer 540_1 may be disposed in the separation space. The eighth insulating layer 540_1 may cover one side surface of the first contact electrode 360_1 to electrically isolate it from the second contact electrode 370_2.

Further, since a plurality of members are patterned simultaneously in the display device 10_1 of FIG. 24, there is an advantage that the number of tasks of the mask process can be reduced. A detailed description of a method of manufacturing the display device 10_1 of FIG. 24 will be given with reference to FIGS. 25 to 29.

FIGS. 25 to 29 are sequence diagrams showing partial steps of a method of manufacturing the display device of FIG. 24.

First, referring to FIG. 25, the second substrate layer 700 of FIG. 12 is prepared, and a seventh insulating material layer 531_1 is formed thereon. The structure and formation method of the second substrate layer 700 are the same as those described above. The seventh insulating material layer 531_1 may be disposed to cover a sixth insulating material layer 521_2. Unlike the display device 10 of FIG. 2, the seventh insulating material layer 531_1 is formed before the upper surface of the pixel electrode 330 is exposed.

Then, referring to FIG. 26, the seventh insulating material layer 531_1 and the sixth insulating material layer 521_1 are patterned simultaneously to expose the pixel electrode 330. Accordingly, one side surface of the seventh insulating material layer 531_1 and one side surface of the sixth insulating material layer 521_1 can be aligned with each other.

Then, referring to FIG. 27, the first contact electrode 360_1 is formed on the upper surface of the pixel electrode 330. The first contact electrode 360_1 may be in partial contact with the fifth insulating material layer 511_1, the light emitting element 350, the sixth insulating material layer 521_1 and the seventh insulating material layer 531_1. One side portion of the first contact electrode 360_1 may be disposed in a region of the upper surface of the seventh insulating material layer 531_1 that overlaps the light emitting element 350. Accordingly, as described later, the eighth insulating layer 5401 may be disposed to cover the one side portion of the first contact electrode 360_1 and may be in contact with the seventh insulating material layer 531_1.

Then, referring to FIG. 28, the common electrode 340 is exposed by patterning the eighth insulating layer 5401 covering the first contact electrode 360_1, the seventh insulating layer 530_1, the sixth insulating layer 520_1 and the eighth insulating layer 540_1. When the common electrode 340 is exposed, the eighth insulating layer 5401 is patterned simultaneously with the sixth insulating layer 521_1 and the seventh insulating layer 531_1. Therefore, one side surface of the eighth insulating layer 5401 can be aligned with the side surfaces of the seventh insulating layer 530_1 and the sixth insulating layer 5201. Further, as described above, since the one side portion of the first contact electrode 360_1 is disposed on the upper surface of the seventh insulating layer 530_1, the eighth insulating layer 540_1 may cover the one side portion of the first contact electrode 360_1.

Then, referring to FIG. 29, the second contact electrode 370_1 is formed on the upper surface of the common electrode 340, and then a passivation layer 550_1 is formed, thereby manufacturing the display device 10_1 of FIG. 24. Since these steps are the same as those described above, a detailed description thereof will be omitted.

FIG. 30 is a cross-sectional view of a display device according to still another embodiment.

A display device 10_2 of FIG. 30 is different from the display device 10 of FIG. 2 in that the eighth insulating layer 540 is omitted and a first contact electrode 360_2 and a second contact electrode 370_2 are separated from each other on substantially the same plane. A passivation layer 550_2 may be disposed in the separation space between the first contact electrode 360_2 and the second contact electrode 370_2 to electrically isolate the first contact electrode 360_2 and the second contact electrode 370_2 from each other. A seventh insulating layer 530_2 is disposed to cover the upper surface and both side surfaces of a sixth insulating layer 520_2. In the illustrated embodiment, the sixth insulating layer 520_2 is recessed inwardly from both side surfaces of the seventh insulating layer 530_2, and is not exposed to the outside. Thus, the sixth insulating layer 520_2 may not be in contact with the first contact electrode 360_2 and the second contact electrode 370_2.

Therefore, since the eighth insulating layer 540 is omitted in comparison with the display device 10 of FIG. 2, the display device 10_2 of FIG. 30 can simplify the members disposed on the fourth insulating layer 310 and, thus, the thickness of the display device 10_2 can be reduced. In addition, regions where the pixel electrode 330 and the common electrode 340 are disposed may be symmetrical with respect to the light emitting element 350. A detailed description of a method of manufacturing the display device 10_2 of FIG. 30 will be given with reference to FIGS. 31 to 33.

FIGS. 31 to 33 are sequence diagrams showing partial steps of a method of manufacturing the display device of FIG. 30.

First, referring to FIG. 31, the second substrate layer 700 of FIG. 12 is prepared, and the sixth insulating layer 520_2 is patterned to simultaneously expose the pixel electrode 330 and the common electrode 340. Since only one mask process is performed, the patterned sixth insulator layer 520_2 may have a symmetrical structure with respect to the center of the light emitting element 350. In this embodiment, since the pixel electrode 330 and the common electrode 340 are patterned to simultaneously expose their upper surfaces, the first contact electrode 360_2 and the second contact electrode 370_2, which will be described later, may be disposed on substantially the same plane.

Then, referring to FIG. 32, the seventh insulating layer 530_2 is patterned so as to cover the upper surface and both side surfaces of the sixth insulating layer 520_2. The sixth insulating layer 520_2 may be patterned simultaneously when the pixel electrode 330 and the common electrode 340 are exposed such that both side surfaces face the pixel electrode 330 and the common electrode 340, respectively. Further, since both side surfaces of the sixth insulating layer 520_2 are recessed inwardly relative to the light emitting element 350, when the seventh insulating layer 530_2 is patterned on the sixth insulating layer 520_2, both side of the surfaces may be covered by the seventh insulating layer 530_2. Accordingly, the sixth insulating layer 520_2 may not be exposed to the outside.

Further, both side surfaces of the seventh insulating layer 530_2 may be aligned with both side surfaces of the light emitting element 350. However, the present disclosure is not limited thereto, and in some embodiments, both side surfaces of the seventh insulating layer 530_2 may be recessed inwardly from both side surfaces of the light emitting element 350.

Then, referring to FIG. 33 the first contact electrode 360_2 and the second contact electrode 370_2 are patterned simultaneously by performing one mask process. In an embodiment, the first contact electrode 360_2 and the second contact electrode 370_2 are patterned to be separated from each other on the upper surface of the seventh insulating layer 530_2. Accordingly, the first contact electrode 360_2 and the second contact electrode 370_2 are exposed such that their one side portions face each other. Since the sixth insulating layer 520_2 is not covered by the seventh insulating layer 530_2 and is not exposed, the first contact electrode 360_2 and the second contact electrode 370_2 are in partial contact with only the seventh insulating layer 530_2, the light emitting element 350 and the fifth insulating layer 510_2.

Finally, the passivation layer 5502 is formed so as to cover the first contact electrode 360_2, the seventh insulating layer 530_2 and the second contact electrode 370_2, thereby manufacturing the display device 10_2 of FIG. 30. The passivation layer 550_2 may be disposed on the seventh insulating layer 530_2 in a region where the first contact electrode 360_2 and the second contact electrode 370_2 are separated from each other and may be in partial contact with the seventh insulating layer 530_2. Additionally, the exposed side portions of the first contact electrode 360_2 and the second contact electrode 370_2 can be protected and electrically isolated from each other by the passivation layer 5502.

FIG. 34 is a cross-sectional view of a display device according to still another embodiment.

A display device 10_3 of FIG. 34 is the same as the display device 10_2 of FIG. 30 except that both side surfaces of a seventh insulating layer 530_3 are aligned with both side surfaces of a sixth insulating layer 520_3. Accordingly, both side surfaces of the sixth insulating layer 520_3 may be exposed to the outside to contact the first contact electrode 360_3 and the second contact electrode 370_3, respectively. Hereinafter, only differences will be described in detail.

In the display device 10_3 of FIG. 34, the seventh insulating layer 530_3 and the sixth insulating layer 520_3 are formed by being patterned simultaneously in one mask process. That is, the seventh insulating layer 530_3 is formed before exposing the pixel electrode 330 and the common electrode 340, and the sixth insulating layer 520_3 and the seventh insulating layer 530_3 are patterned simultaneously. A detailed description of a method of manufacturing the display device 10_3 of FIG. 34 will be given with reference to FIGS. 34 and 35.

FIGS. 35 and 36 are sequence diagrams showing partial steps of a method of manufacturing the display device of FIG. 34.

First, referring to FIG. 35, the second substrate layer 700 of FIG. 12 is prepared and the seventh insulating layer 530_3 and the sixth insulating layer 520_3 are patterned simultaneously to expose the pixel electrode 330 and the common electrode 340. Accordingly, both side surfaces of the sixth insulating layer 520_3 and the seventh insulating layer 530_3 may be aligned with each other, and may be recessed inwardly relative to both side surfaces of the light emitting element 350. However, as described above with reference to FIG. 32, in some embodiments, both side surfaces of the seventh insulating layer 530_3 and the sixth insulating layer 520_3 may be aligned with both side surfaces of the light emitting element 350. The embodiments of the present disclosure are not limited thereto.

Then, referring to FIG. 36, the first contact electrode 360_3 and the second contact electrode 370_3 are patterned simultaneously on the exposed upper surfaces of the pixel electrode 330 and the common electrode 340, respectively. Then, a passivation layer 550_3 is formed to cover the first contact electrode 360_3 and the second contact electrode 370_3, thereby manufacturing the display device 10_3 of FIG. 34. Since these steps are the same as those described above, a detailed description thereof will be omitted.

Additionally, as described above with reference to the drawings, the partition 410 of the display device 10 has a side surface which is inclined and an upper surface which is horizontally flat. The upper surface and both side surfaces of the partition 410 may be formed to be angled with respect to each other and may have a substantially trapezoidal shape. However, the present disclosure is not limited thereto, and the partition 410 may have various structures. For example, the upper surface and side surfaces of the partition 410 may have curvatures.

FIG. 37 is a cross-sectional view of a display device according to still another embodiment.

Referring to FIG. 37, the partition 410 of the display device 10 may be formed such that an outer circumferential surface thereof has a curvature and gently protrudes from the fourth insulating layer 310. That is, the partition 410 may have a substantially semi-elliptical shape. Accordingly, when a plurality of members, e.g., the reflection layers 331 and 341 and the electrode layers 332 and 342, disposed on the partition 410 are patterned, materials included in the reflective layers 331 and 341 and the electrode layers 332 and 342 may be smoothly deposited or formed on the partition 410. Therefore, a disconnection or defect of a material that may occur when manufacturing the display device 10 can be reduced.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

The invention claimed is:

1. A display device comprising:
a first electrode;
a second electrode facing the first electrode;
a first insulating layer on the first electrode and the second electrode and positioned between the first electrode and the second electrode;
a light emitting element on the first insulating layer;
a second insulating layer covering the light emitting element and exposing first and second end portions of the light emitting element;
a third insulating layer on the second insulating layer;
a first contact electrode electrically connected to the first electrode, the first contact electrode being on the third insulating layer and in contact with the first end portion of the light emitting element exposed by the second insulating layer; and
a second contact electrode electrically connected to the second electrode, the second contact electrode being on the third insulating layer and in contact with a second end portion of the light emitting element exposed by the second insulating layer.

2. The display device of claim 1, wherein the first contact electrode and the second contact electrode are opposed to each other and separated from each other, and
wherein the display device further comprises a fourth insulating layer covering the first contact electrode and the second contact electrode, the fourth insulating layer being in a region where the first contact electrode and the second contact electrode are separated from each other.

3. The display device of claim 2, wherein the third insulating layer covers first and second side surfaces of the second insulating layer.

4. The display device of claim 3, wherein at least a part of each of the first contact electrode and the second contact electrode is in contact with an upper surface of the third insulating layer, and
wherein an end portion of each of the first contact electrode and the second contact electrode in a mutually opposing direction is on the upper surface of the third insulating layer.

5. The display device of claim 4, wherein the first contact electrode and the second contact electrode are on substantially a same plane.

6. The display device of claim 5, wherein respective first surfaces of the first contact electrode and the second contact electrode in contact with a side surface of the third insulating layer are aligned with respective second surfaces of the first contact electrode and the second contact electrode in contact with the light emitting element.

7. The display device of claim 5, wherein respective first surfaces of the first contact electrode and the second contact electrode in contact with a side surface of the third insulating layer are recessed toward a center of the light emitting element from respective second surfaces of the first contact electrode and the second contact electrode in contact with the light emitting element.

8. The display device of claim 6, wherein a lower surface of the light emitting element is at least partially opposed to the first insulating layer and separated from the first insulating layer by a separation space, and an organic filler made of a same material as the third insulating layer is partially filled in the separation space between the lower surface of the light emitting element and the first insulating layer.

9. The display device of claim 8, wherein the first contact electrode is in partial contact with the organic filler.

10. The display device of claim 9, wherein the light emitting element has a cylindrical shape, and wherein a part of the lower surface of the light emitting element is in direct contact with the first insulating layer.

11. The display device of claim 1, further comprising a fifth insulating layer covering an upper surface of the first contact electrode and in contact with a lower surface of the second contact electrode.

12. The display device of claim 11, further comprising a passivation layer covering an upper surface of each of the second contact electrode and the fifth insulating passivation layer.

13. The display device of claim 12, wherein one side portion of the second contact electrode facing the first contact electrode is disposed on the fifth insulating layer, and
wherein one side portion of the first contact electrode facing the second contact electrode is below the fifth insulating layer.

14. The display device of claim 13, wherein one side surface of the fifth insulating layer in contact with the second contact electrode is aligned with one side surface of the third insulating layer in contact with the second contact electrode.

15. The display device of claim 14, wherein a lower surface of the light emitting element is at least partially opposed to the first insulating layer and separated from the first insulating layer by a separation space, and an organic filler made of a same material as the third insulating layer is partially filled in the separation space between the lower surface of the light emitting element and the first insulating layer.

16. The display device of claim 15, wherein the first contact electrode is in partial contact with the organic filler.

17. The display device of claim 16, wherein the first end portion of the light emitting element includes a semiconductor material with n-type conductivity, and the second end portion of the light emitting element includes a semiconductor material with p-type conductivity, and
wherein an active material layer is disposed between the first end portion and the second end portion.

18. The display device of claim 7, wherein a lower surface of the light emitting element is at least partially opposed to the first insulating layer and separated from the first insulating layer by a separation space, and an organic filler made of a same material as the third insulating layer is partially filled in the separation space between the lower surface of the light emitting element and the first insulating layer.

19. The display device of claim 18, wherein the first contact electrode is in partial contact with the organic filler.

20. The display device of claim 19, wherein the light emitting element has a cylindrical shape, and wherein a part of the lower surface of the light emitting element is in direct contact with the first insulating layer.

* * * * *